(12) United States Patent
Lee et al.

(10) Patent No.: US 10,431,459 B2
(45) Date of Patent: Oct. 1, 2019

(54) METHODS OF FABRICATING SEMICONDUCTOR DEVICE

(71) Applicants: Woohyun Lee, Seoul (KR); Sang-Kuk Kim, Seongnam-si (KR); Jong-Kyu Kim, Seongnam-si (KR); Yil-hyung Lee, Hwaseong-si (KR); Jongsoon Park, Suwon-si (KR); Hyeji Yoon, Hwaseong-si (KR)

(72) Inventors: Woohyun Lee, Seoul (KR); Sang-Kuk Kim, Seongnam-si (KR); Jong-Kyu Kim, Seongnam-si (KR); Yil-hyung Lee, Hwaseong-si (KR); Jongsoon Park, Suwon-si (KR); Hyeji Yoon, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 114 days.

(21) Appl. No.: 15/668,689

(22) Filed: Aug. 3, 2017

(65) Prior Publication Data

US 2018/0197740 A1   Jul. 12, 2018

(30) Foreign Application Priority Data

Jan. 11, 2017   (KR) .......................... 10-2017-0004322

(51) Int. Cl.
*H01L 21/033* (2006.01)
*H01L 21/311* (2006.01)
*H01L 21/687* (2006.01)

(52) U.S. Cl.
CPC ...... *H01L 21/0338* (2013.01); *H01L 21/0335* (2013.01); *H01L 21/0337* (2013.01); *H01L 21/31116* (2013.01); *H01L 21/31144* (2013.01); *H01L 21/68764* (2013.01)

(58) Field of Classification Search
CPC ........... H01L 21/31144; H01L 21/0337; H01L 21/0338; H01L 21/31116; H01L 21/68764; G03F 7/0002
See application file for complete search history.

(56) References Cited

U.S. PATENT DOCUMENTS

| 9,070,869 | B2 | 6/2015 | Jung et al. |
| 9,166,154 | B2 | 10/2015 | Satoh et al. |
| 9,190,607 | B2 | 11/2015 | Nomachi |
| 9,257,295 | B2 | 2/2016 | Singh et al. |

(Continued)

*Primary Examiner* — Jasmine J Clark
(74) *Attorney, Agent, or Firm* — Renaissance IP Law Group LLP

(57) ABSTRACT

An etching target layer is formed on a substrate. An upper mask layer is formed on the etching target layer. A plurality of preliminary mask patterns is formed on the upper mask layer. The plurality of preliminary mask patterns is arranged at a first pitch. Two neighboring preliminary mask patterns of the plurality of preliminary mask patterns define a preliminary opening. An ion beam etching process is performed on the upper mask layer using the plurality of preliminary mask patterns as an etch mask to form a first preliminary-interim-mask pattern and a pair of second preliminary-interim-mask patterns. The first preliminary-interim-mask pattern is formed between one of the pair of second preliminary-interim-mask patterns and the other of the pair of second preliminary-interim-mask patterns.

20 Claims, 30 Drawing Sheets

(56) References Cited

U.S. PATENT DOCUMENTS

| | | |
|---|---|---|
| 9,472,653 B2 | 10/2016 | Kim et al. |
| 9,577,183 B2 | 2/2017 | Kim et al. |
| 2014/0159176 A1 | 6/2014 | Nomachi |
| 2014/0170776 A1 | 6/2014 | Satoh et al. |
| 2015/0090583 A1 | 4/2015 | Kodaira et al. |
| 2015/0104882 A1 | 4/2015 | Jung et al. |
| 2015/0179465 A1 | 6/2015 | Singh et al. |
| 2015/0287911 A1 | 10/2015 | Kim et al. |
| 2016/0148808 A1 | 5/2016 | Kim et al. |
| 2016/0149123 A1 | 5/2016 | Park et al. |
| 2018/0047564 A1* | 2/2018 | Park ..................... H01L 21/263 |

* cited by examiner

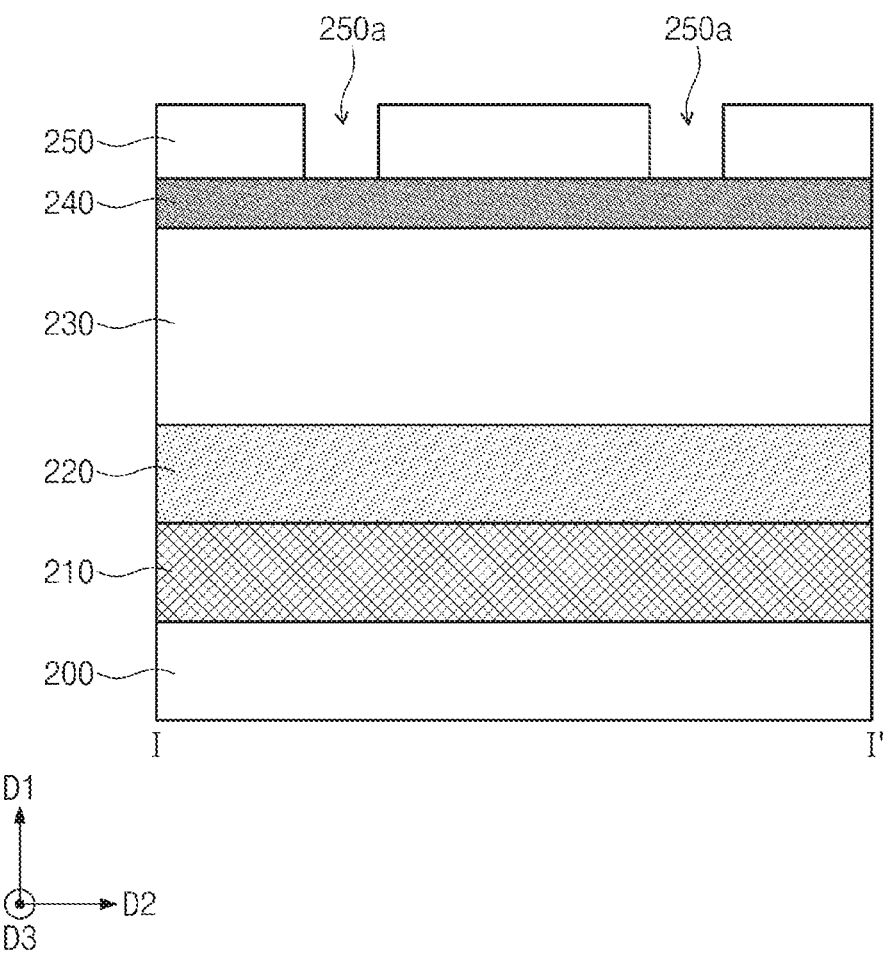

METHODS OF FABRICATING SEMICONDUCTOR DEVICE

CROSS-REFERENCE TO RELATED APPLICATION

This application claims priority under 35 U.S.C § 119 to Korean Patent Application No. 10-2017-0004322 filed on Jan. 11, 2017 in the Korean Intellectual Property Office, the disclosure of which is incorporated by reference herein in its entirety.

TECHNICAL FIELD

The present inventive concept relates to a method of fabricating a semiconductor device.

DISCUSSION OF RELATED ART

Manufacturing highly integrated semiconductor devices may include a process for forming fine patterns. However, due to a resolution limit in photolithography apparatuses, it is difficult to form finer-pitch patterns.

SUMMARY

According to an exemplary embodiment of the present inventive concept, a method of fabricating a semiconductor device is provided as follows. An etching target layer is formed on a substrate. An upper mask layer is formed on the etching target layer. A plurality of preliminary mask patterns is formed on the upper mask layer. Two neighboring preliminary mask patterns of the plurality of preliminary mask patterns define a preliminary opening. An ion beam etching process is performed on the upper mask layer using the plurality of preliminary mask patterns as an etch mask to form a first preliminary-interim-mask pattern and a pair of second preliminary-interim-mask patterns. The first preliminary-interim-mask pattern is formed between one of the pair of second preliminary-interim-mask patterns and the other of the pair of second preliminary-interim-mask patterns.

According to an exemplary embodiment of the present inventive concept, a method of fabricating a semiconductor device is provided as follows. An etching target layer is formed on a substrate. An upper mask layer is formed on the etching target layer. A preliminary mask pattern is formed on the upper mask layer. The preliminary mask pattern has a preliminary opening exposing a portion of the upper mask layer. An ion beam etching process is performed on the upper mask layer using the preliminary mask pattern as an etch mask to form a first preliminary-interim-mask pattern and a second preliminary-interim-mask pattern. The ion beam etching process is performed through the preliminary opening on the upper mask layer such that the first preliminary-interim-mask pattern, when viewed in plan, is formed below the preliminary opening. The second preliminary-interim-mask pattern, when viewed in plan, is formed below the preliminary mask pattern.

According to an exemplary embodiment of the present inventive concept, a method of fabricating a semiconductor device is provided as follows. An etching target layer is formed on a substrate. An upper mask layer is formed on the etching target layer. A plurality of preliminary mask patterns is formed on the upper mask layer. The plurality of preliminary mask patterns is spaced apart from each other. An ion beam etching process is performed on the upper mask layer to form a plurality of preliminary-interim-mask patterns having a triangular-prism shape and a trapezoidal-prism shape alternately.

BRIEF DESCRIPTION OF THE DRAWINGS

These and other features of the present inventive concept will become more apparent by describing in detail exemplary embodiments thereof with reference to the accompanying drawings of which:

FIGS. 9A to 16A are perspective views illustrating a method of fabricating a semiconductor device according to an exemplary embodiment of the present inventive concept;

FIGS. 9B to 16B are cross-sectional views taken along line I-I' of FIGS. 9A to 16A according to an exemplary embodiment of the present inventive concept;

FIGS. 17A to 19A are plan views illustrating a method of fabricating a semiconductor device according to an exemplary embodiment of the present inventive concept; and FIGS. 17B to 19B are cross-sectional views taken along line I-I' of FIGS. 17A to 19A according to an exemplary embodiment of the present inventive concept.

Figure 1:
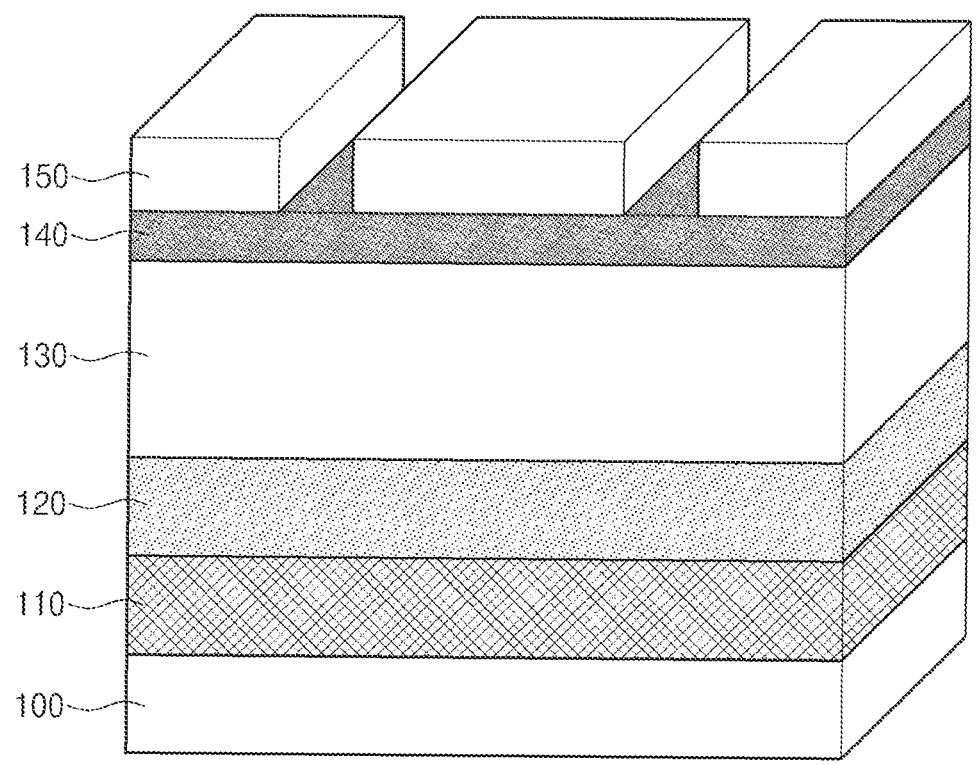
FIGS. 1 to 8 are perspective views illustrating a method of fabricating a semiconductor device according to an exemplary embodiment of the present inventive concept.
Figure 1:
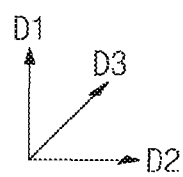

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIGS. 1 to 8 are perspective views illustrating a method of fabricating a semiconductor device according to an exemplary embodiment of the present inventive concept.

Referring to FIG. 1, an etching target layer 110, a lower mask layer 120, an upper mask layer 130, and a preliminary mask layer 140 may be sequentially formed on a substrate 100. For example, the etching target layer 110, the lower mask layer 120, the upper mask layer 130, and the preliminary mask layer 140 may be sequentially stacked along a first direction D1 substantially perpendicular to a top surface of the substrate 100.

The substrate 100 may be a semiconductor substrate, for example, a silicon substrate, a germanium substrate, a silicon-germanium substrate, a silicon-on-insulator (SOI) substrate, or a germanium-on-insulator (GOI) substrate. The etching target layer 110 may include a conductive material, a semiconductor material, or an insulating material. The lower mask layer 120 may include a material having etch selectivity with respect to the etching target layer 110. The upper mask layer 130 may include a material having etch selectivity with respect to the lower mask layer 120. The preliminary mask layer 140 may include a material having etch selectivity with respect to the upper mask layer 130.

Sacrificial patterns 150 may be formed on the preliminary mask layer 140. The sacrificial patterns 150 may be photoresist patterns or hardmask patterns. If the sacrificial patterns 150 are hardmask patterns, the sacrificial patterns 150 may include oxide, nitride, or oxynitride that have etch selectivity with respect to the preliminary mask layer 140. The formation of the sacrificial patterns 150 may include performing a photolithography process using a photomask that defines a planar shape of each sacrificial pattern 150. The photomask may further define the location of each sacrificial pattern 150 on the preliminary mask layer 140.

The sacrificial patterns 150 may be arranged and spaced apart from each other along a second direction D2 substantially parallel to the top surface of the substrate 100. For example, each of the sacrificial patterns 150 may have a linear shape extending in a third direction D3 that is substantially parallel to the top surface of the substrate 100 and crosses the second direction D2.

Figure 2:
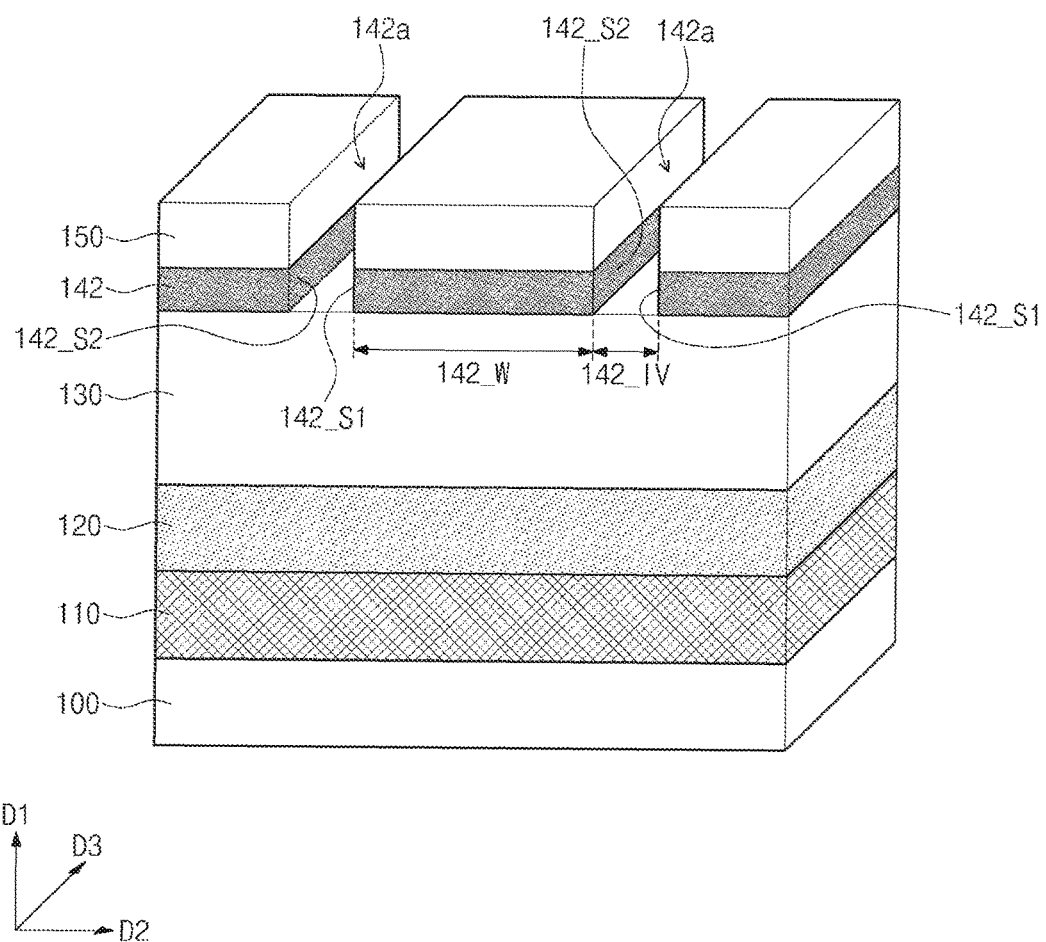

Referring to FIG. 2, preliminary mask patterns 142 may be formed. The formation of the preliminary mask patterns 142 may include etching the preliminary mask layer 140 using the sacrificial patterns 150 as an etch mask. The preliminary mask patterns 142 may be arranged along the second direction D2. Each of the preliminary mask patterns 142 may have a width 142_W in the second direction D2. The preliminary mask patterns 142 may be spaced apart from each other along the second direction D2. Each of the preliminary mask patterns 142 may have a linear shape extending in the third direction D3. Preliminary openings 142a each may be defined between the preliminary mask patterns 142 adjacent to each other. Each of the preliminary openings 142a may have a linear shape extending in the third direction D3. The preliminary openings 142a may expose the upper mask layer 130. For example, each of the preliminary openings 142a may have a width in the second direction D2, and the width of each preliminary opening 142a may be the same as an interval 142_IV in the second direction D2 between the preliminary mask patterns 142 adjacent to each other. A first pitch between the preliminary mask patterns 142 adjacent to each other may be defined as a sum of the width 142_W and the interval 142_IV. In other words, the first pitch may correspond to the center-to-center distance between two neighboring preliminary mask patterns 142.

Each of the preliminary mask patterns 142 may have a first sidewall 142_S1 and a second sidewall 142_S2. The first sidewall 142_S1 of one of the preliminary mask patterns 142 may face the second sidewall 142_S2 of another preliminary mask pattern 142 adjacent to the one of the preliminary mask patterns 142.

Figure 3:
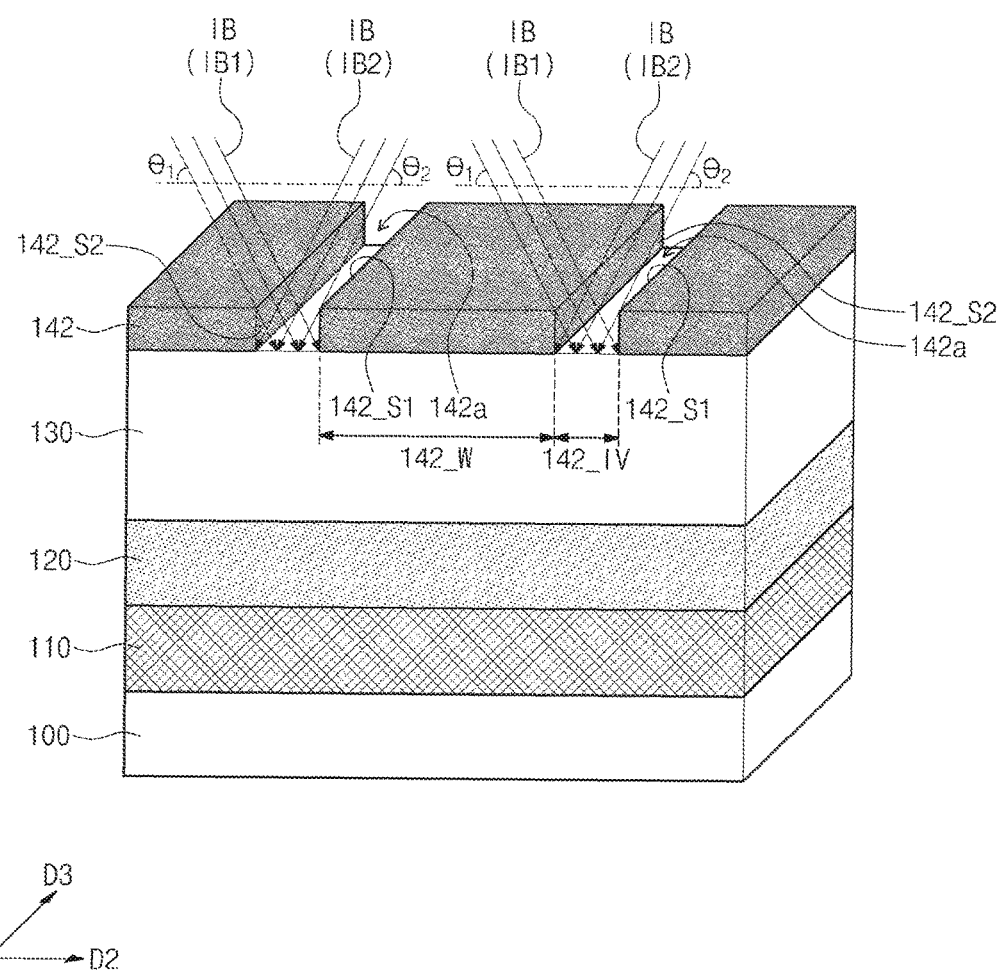

Referring to FIG. 3, the sacrificial patterns 150 may be selectively removed. The selective removal of the sacrificial patterns 150 may be performed by using an etching process having etch selectivity with respect to the upper mask layer 130 and the preliminary mask patterns 142.

Figure 4:
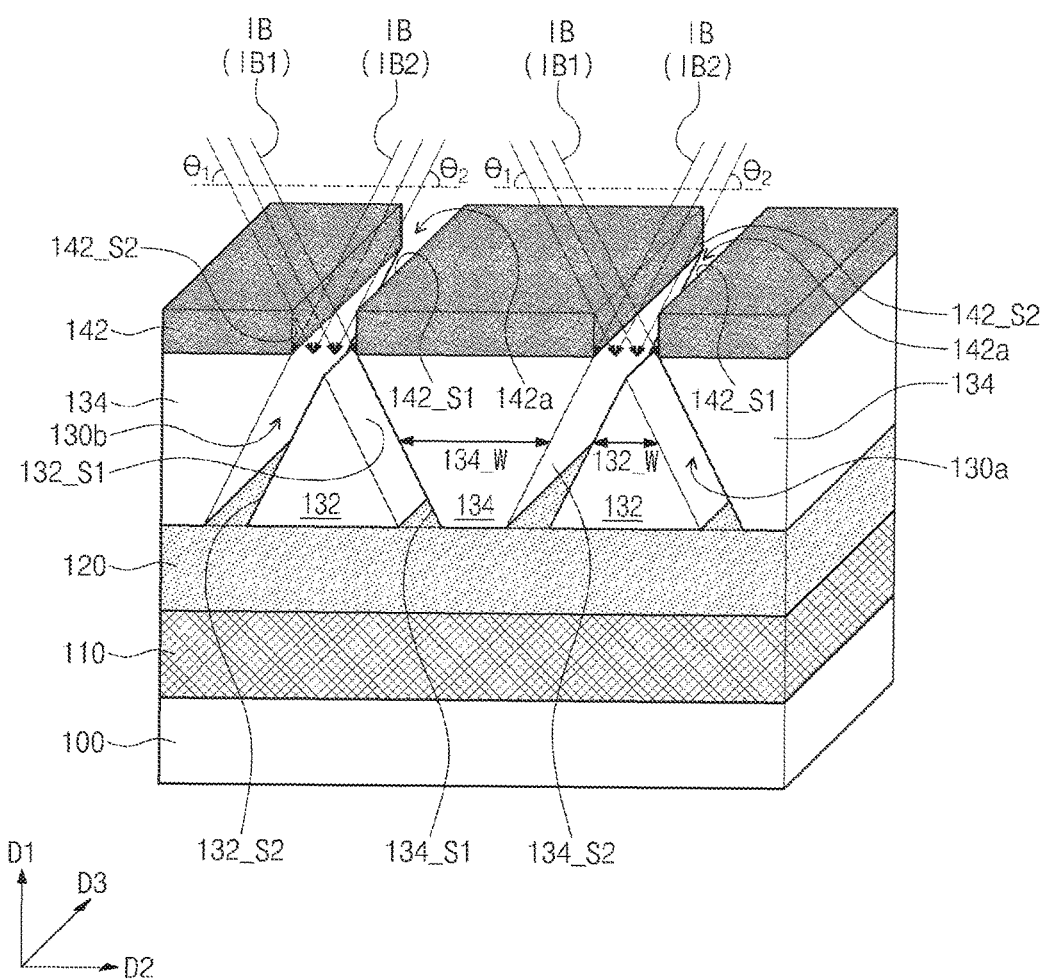

Referring to FIGS. 3 and 4, the upper mask layer 130 may be patterned to upper mask patterns 132 and 134. The upper mask patterns 132 and 134 may also be referred to as preliminary-interim-mask patterns 132 and 134. The upper mask patterns 132 and 134 may include first upper mask patterns (first preliminary-interim-mask patterns) 132 and second upper mask patterns (second preliminary-interim-mask patterns) 134. The first and second upper mask patterns 132 and 134 may be alternately arranged and spaced apart from each other along the second direction D2.

When viewed in plan, the first upper mask patterns 132 may be positioned to correspond to the preliminary openings 142a, and the second upper mask patterns 134 may be positioned to correspond to the preliminary mask patterns 142. For example, the first upper mask patterns 132 may be exposed through the preliminary openings 142a. The second upper mask patterns 134 may be covered with preliminary mask patterns 142. Hereinafter, unless otherwise defined, "when viewed in plan" means when viewed from the above of a top surface of the substrate 100.

When viewed in plan, each of the first upper mask patterns 132 may partially overlap its adjacent a pair of the preliminary mask patterns 142. Each of the first upper mask patterns 132 may have a first portion exposed through the preliminary opening 142a and a second portion overlapped with the preliminary mask patterns 142 vertically, for example, in the first direction D1.

When viewed in plan, each of the first upper mask patterns 132 may have a linear shape extending in the third direction D3. Each of the first upper mask patterns 132 may have a width 132_W in the second direction D2. The width 132_W may decrease upwardly in the first direction D1 from the lower mask layer 120 toward the preliminary opening 142a. For example, each of the first upper mask patterns 132 may have first and second sidewalls 132_S1 and 132_S2 opposite to each other. The sidewalls 132_S1 and 132_S2 may be inclined so that a distance between the sidewalls 132_S1 and 132_S2 decreases upwardly in the first direction D1 from the lower mask layer 120 toward the preliminary opening 142a. The distance may be measured in the second direction D2. For example, the first upper mask patterns 132 may be of a triangular-prism shape so that when viewed in cross-section, each of the first upper mask patterns 132 may have a triangular shape. The base of the first upper mask pattern 132 may be in contact with the lower mask layer 120.

When viewed in plan, each of the second upper mask patterns 134 may have a linear shape extending in the third direction D3. Each of the second upper mask patterns 134 may have a width 134_W in the second direction D2. The width 134_W may increase upwardly in the first direction D1 from the lower mask layer 120 toward the preliminary mask pattern 142. For example, each of the second upper mask patterns 134 may have first and second sidewalls 134_S1 and 134_S2 opposite to each other. The sidewalls 134_S1 and 134_S2 may be inclined away so that a distance between the sidewalls 134_S1 and 134_S2 may increase upwardly in the first direction D1 from the lower mask layer 120 toward the preliminary mask pattern 142. For example, the second upper mask patterns 134 each may be of a trapezoidal-prism shape, and when viewed in cross-section, each of the second upper mask patterns 134 may have a trapezoidal shape.

According to an exemplary embodiment, the first sidewall 134_S1 of the second upper mask pattern 134 may face the first sidewall 132_S1 of the first upper mask pattern 132. The second sidewall 134_S2 of the second upper mask pattern 134 may face the second sidewall 132_S2 of the first upper mask pattern 132. In an exemplary embodiment, the first sidewall 134_S1 of the second upper mask pattern 134 may be substantially parallel to the first sidewall 132_S1 of the first upper mask pattern 132 in the third direction D3. The second sidewall 134_S2 of the second upper mask pattern 134 may be substantially parallel to the second sidewall 132_S2 of the first upper mask pattern 132 in the third direction D3. In an exemplary embodiment, the first sidewall 134_S1 of the second upper mask pattern 134 may overlap partially the first sidewall 132_S1 of the first upper mask pattern 132 in the first direction D1. The second sidewall 134_S2 of the second upper mask pattern 134 may overlap partially the second sidewall 132_S2 of the first upper mask pattern 132 in the first direction D1.

According to an exemplary embodiment, the upper mask patterns (the preliminary-interim-mask patterns) 132 and 134 may include different shapes including a triangular-prism shape and a trapezoidal-prism shape alternately arranged in the second direction D2.

The formation of the upper mask patterns 132 and 134 may be performed by an etching process using an ion beam IB. The etching process using the ion beam IB may be referred to as an ion beam etching process. During the ion beam etching process, ion beams IB1 and IB2 may be irradiated onto the upper mask layer 130 and the preliminary mask patterns 142. For example, the ion beams IB1 and IB2 may be incident on the upper mask layer 130 through the preliminary openings 142a.

In an exemplary embodiment, each of the ion beams IB1 and IB2 (collectively, IB) may be irradiated at an incident angle. The incident angle of the ion beam IB may be defined as angle between the ion beam IB and a surface parallel to the top surface of the substrate 100. With the ion beams IB1 and IB2 directional, the ion beam etching process may be anisotropic. For example, the upper mask layer 130 exposed through the preliminary openings 142a may be etched in a direction parallel to an irradiation direction of each of the ion beams IB1 and IB2. The irradiation directions of the ion beams IB1 and IB2 may be represented by their incident angles $\theta_1$ and $\theta_2$.

The ion beams IB1 and IB2 irradiated during the ion beam etching process may include a first ion beam IB1 and a second ion beam IB2. The first and second ion beams IB1 and IB2 may have their irradiation directions crossing each other. For example, the first ion beam IB1 may be irradiated at a first incident angle $\theta_1$ toward the first sidewall 142_S1 of each of the preliminary mask patterns 142, and then the second ion beam IB2 may be irradiated at a second incident angle $\theta_2$ toward the second sidewall 142_S2 of each of the preliminary mask patterns 142. The first and second incident angles $\theta_1$ and $\theta_2$ may be substantially the same. The present inventive concept is not limited thereto. In an exemplary embodiment, the first incident angle $\theta_1$ of the first ion beam IB1 may be different from the second incident angle $\theta_2$ of the second ion beam IB2. In an exemplary embodiment, during the ion beam etching process, the first and second ion beams IB1 and IB2 may be simultaneously irradiated. In an exemplary embodiment, during the ion beam etching process, the substrate 100 may rotate around its rotational axis along a normal line perpendicular to the top surface of the substrate 100. During the ion beam etching process, the first ion beam IB1 may form through the preliminary openings 142a first upper openings 130a in the upper mask layer 130 and the second ion beam IB2 may through the preliminary openings 142a form second upper openings 130b in the upper mask layer 130. For example, the shape of the preliminary opening 142a may be transferred down to the lower mask layer 120 substantially parallel to the irradiation directions of the first and second ion beams IB1 and IB2. Each of the first upper openings 130a may be connected to corresponding one of the preliminary openings 142a, and each of the second upper openings 130b may also be connected to corresponding one of the preliminary openings 142a. Due to directionality of the ion beam IB, each of the first upper openings 130a may extend substantially parallel to the irradiation direction of the first ion beam IB1, and each of the second upper openings 130b may extend substantially parallel to the irradiation direction of the second ion beam IB2.

The first and second upper openings 130a and 130b may define the first and second upper mask patterns 132 and 134. For example, the first upper openings 130a may define the first sidewalls 132_S1 of the first upper mask patterns 132 and the first sidewalls 134_S1 of the second upper mask patterns 134, and the second upper openings 130b may define the second sidewalls 132_S2 of the first upper mask patterns 132 and the second sidewalls 134_S2 of the second upper mask patterns 134. The first sidewalls 132_S1 of the first upper mask patterns 132 may be substantially parallel to the first sidewalls 134_S1 of the second upper mask patterns 134 in the third direction D3, and the second sidewalls 132_S2 of the first upper mask patterns 132 may be substantially parallel to the second sidewalls 134_S2 of the second upper mask patterns 134 in the third direction D3. The incident angle $\theta_1$ of the first ion beam IB1 may control the degree of inclination of the first sidewalls 132_S1 and 134_S1 of the first and second upper mask patterns 132 and 134, and incident angle $\theta_2$ of the second ion beam IB2 may control the degree of inclination of the second sidewalls 132_S2 and 134_S2 of the first and second upper mask patterns 132 and 134.

In the ion beam etching process, a pair of the first and second upper openings 130a and 130b may be formed, with a tilt irradiation of an ion beam as described above, through a single preliminary opening 142a. The first and second upper openings 130a and 130b may elongate in directions intersecting with each other. For example, the first and second upper openings 130a and 130b may meet each other to define the first upper mask patterns 132. The first upper mask patterns 132 may be formed below corresponding preliminary openings 142a. The pair of the first and second upper openings 130a and 130b may be connected to each other on the vertex of the first upper mask pattern 132.

It has been discussed so far how to form the upper mask patterns 132 and 134 using the ion beam etching process using the ion beam IB. The present inventive concept, however, is not limited to the above description, and thus any other etching processes having directionality may be employed to form the upper mask patterns 132 and 134.

Figure 5:
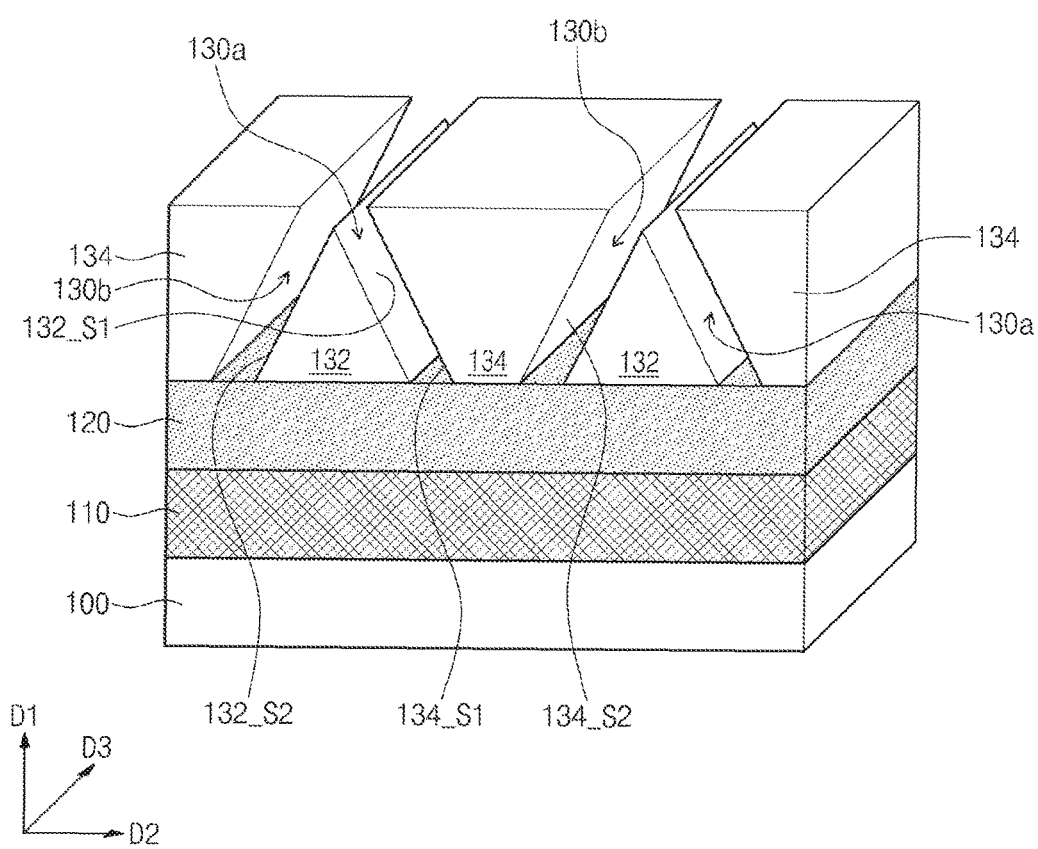

Referring to FIG. 5, the preliminary mask patterns 142 may be selectively removed. The selective removal of the preliminary mask patterns 142 may be performed, for example, by using an etching process having etch selectivity with respect to the lower mask layer 120 and the upper mask patterns 132 and 134.

Figure 6:
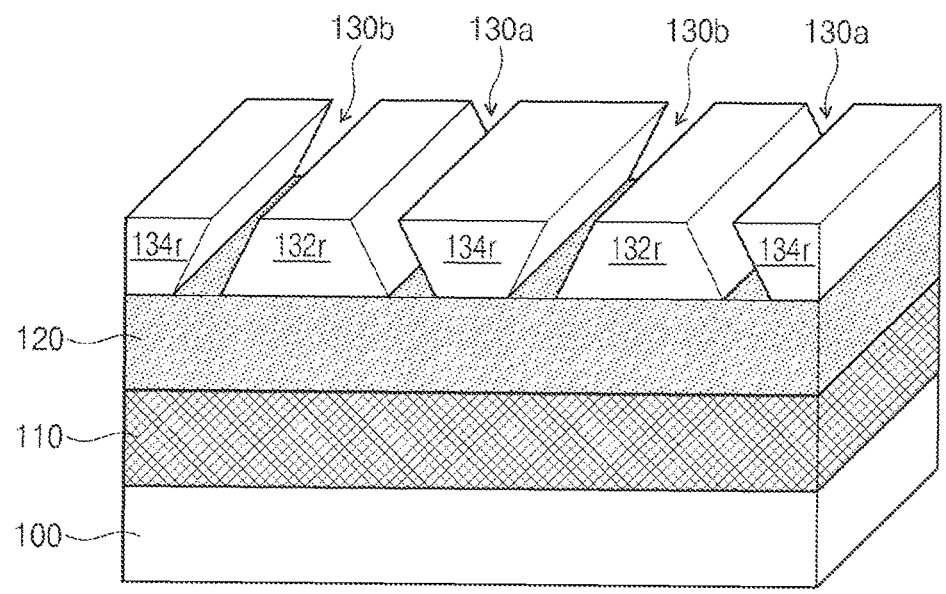

Referring to FIG. 6, each of the first and second upper mask patterns (the preliminary-interim-mask patterns) 132 and 134 may be partially removed using a first etching process so that their upper portions are removed to form first and second upper mask patterns 132r and 134r having reduced thicknesses. The first and second upper mask patterns 132r and 134r of FIG. 6 may also be referred to as interim-mask patterns. For example, an etch-back process may be performed to remove the upper portion of each of the first and second upper mask patterns 132 and 134. The pair of the first and second upper openings 130a and 130b may be separated from each other. The present inventive concept is not limited thereto. For example, the upper portion of each of the first and second upper mask patterns 132 and 134 may be removed using a chemical-mechanical-planarization (CMP) process. In an exemplary embodiment, a combination of an etch-back process and a CMP process may be performed to remove the upper portion of each of the first and second upper mask patterns 132 and 134.

In an exemplary embodiment, each of the first and second upper mask patterns 132 and 134 may be partially removed at least until the first and second upper mask patterns (the interim-mask patterns) 132r and 134r are non-overlapped vertically in the first direction D1.

Figure 7:
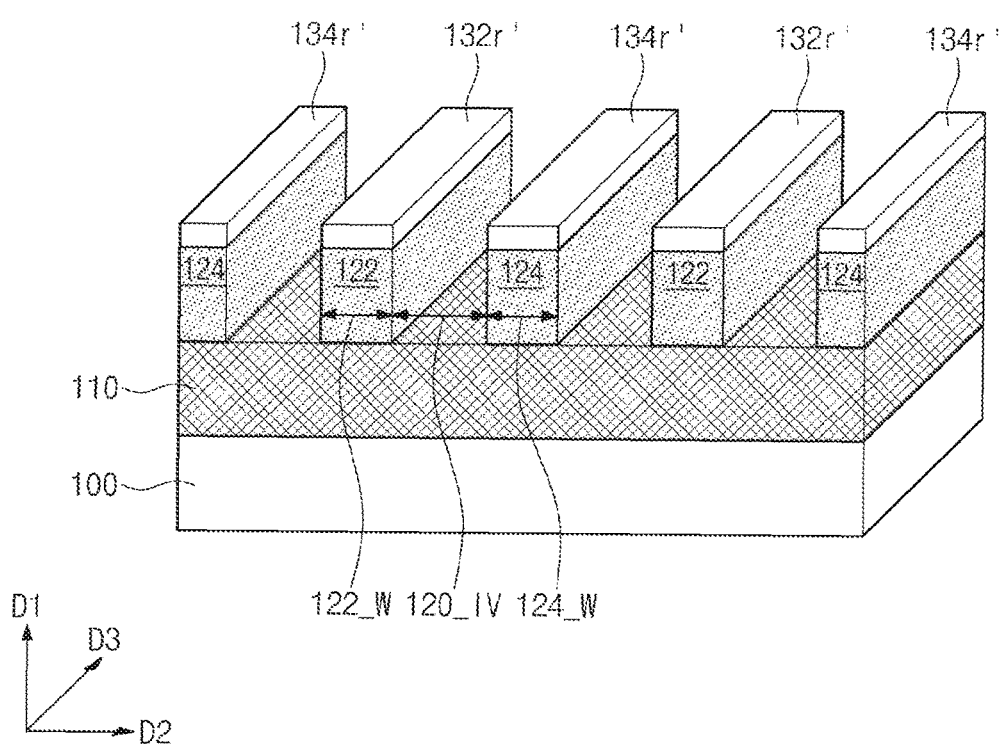

Referring to FIG. 7, lower mask patterns 122 and 124 may be formed. The lower mask patterns 122 and 124 may also be referred to as target mask patterns to be used for patterning the etching target layer 110. The formation of the lower mask patterns 122 and 124 may include performing a second etching process using the thickness-reduced first and second upper mask patterns (the interim-mask patterns) 132r and 134r as an etch mask on the lower mask layer 120.

In the second etching process, the interim-mask patterns 132r and 134r may shrink in size, and thus after the second etching process is completed, the interim-mask patterns 132r and 134r may remain on top surfaces of the lower mask patterns 122 and 124 as first and second remaining-interim-mask patterns 132r' and 134r'. For example, the thicknesses of the interim-mask patterns 132r and 134r may reduce in the second etching process.

The lower mask patterns (the target mask patterns) 122 and 124 may include first lower mask patterns (first target mask patterns) 122 formed below the first remaining-interim-mask patterns 132r' and second lower mask patterns 124 formed below the second remaining-interim-mask patterns 134r'.

In the second etching process where the lower mask layer 120 is patterned using the interim-mask patterns 132r and 134r as an etch mask, the first upper mask pattern 132r may shrink in a vertical direction of the first direction D1, as shown in a circled drawing of FIG. 6. In an exemplary embodiment, the second etching process may be performed using an anisotropic etching process including a reactive ion etching process. In this case, the surface of the first upper mask pattern 132r may recessed vertically so that the width of the first upper mask pattern 132r is reduced.

In FIG. 7, the first and second lower mask patterns (target mask patterns) 122 and 124 may be alternately arranged along the second direction D2. Each of the first lower mask patterns 122 may have a width 122_W in the second direction D2, and each of the second lower mask patterns 124 may have a width 124_W in the second direction D2. For example, each of the first and second lower mask patterns 122 and 124 may have a linear shape extending in the third direction D3. A second pitch between the lower mask patterns 122 and 124 adjacent to each other may be defined as a sum of an interval 120_IV between a pair of neighboring first and second lower mask patterns 122 and 124 and the width 122_W (or the width 124_W) in the second direction D2 of the first lower mask pattern 122 (or the second lower mask pattern 124). The second pitch between the lower mask patterns 122 and 124 may be less than the first pitch between the preliminary mask patterns 142. In an exemplary embodiment, the width 122_W of the first lower mask pattern 122 may be substantially the same as the width 124_W of the second lower mask pattern 124. The present inventive concept is not limited thereto. For example, the width 122_W of the first lower mask pattern 122 may be different from the width 124_W of the second lower mask pattern 124.

In an exemplary embodiment, the second etching process of FIG. 7 may be controlled such that the first and second remaining-interim-mask patterns 132r' and 134r' may have the same width. In this case, the width 122_W of the first lower mask pattern (the first target mask pattern) 122 may be substantially the same with the width 124_W of the second lower mask pattern (the second target mask pattern) 124.

Each of the first target mask patterns 122 may be formed under one of the preliminary openings 142a. In this case, the shape of the preliminary openings 142a may be transferred vertically through the first preliminary-interim-mask pattern 132 down to the first target mask pattern 122.

Each of the second target mask patterns 124 may be formed under one of the preliminary mask patterns 142. In this case, the shape of the preliminary openings 142a may be transferred in an inclined direction through the second preliminary-interim-mask pattern 134 down to the second target mask pattern 124.

Figure 8:
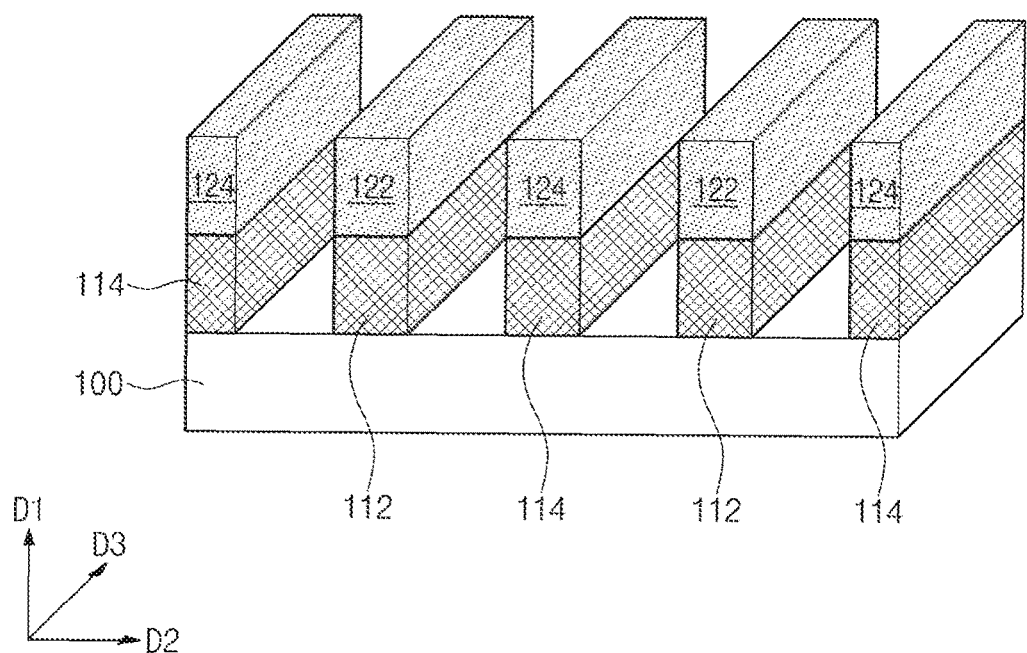

Referring to FIG. 8, target patterns 112 and 114 may be formed. The formation of the target patterns 112 and 114 may include performing a third etching process using the first and second lower mask patterns 122 and 124 as an etch mask on the etching target layer 110. The target patterns 112 and 114 may include first target patterns 112 formed below the first lower mask patterns (first target mask patterns) 122 and second target patterns 114 formed below the second lower mask patterns (second target mask patterns) 124. The target patterns 112 and 114 may be arranged at a third pitch substantially the same as the second pitch between the lower mask patterns 122 and 124. Thus, the third pitch between the target patterns 112 and 114 may be less than the first pitch of the preliminary mask patterns 142.

In an exemplary embodiment, the third pitch may be about the half of the first pitch. If a photolithography apparatus has the first pitch as its minimum pitch, the etching target layer 110 may be patterned to the target patterns 112 and 114 arranged at the half of the first pitch, for example. The present inventive concept is not limited thereto. For example, the etching target layer 110 may be patterned to target patterns 112 and 114 at a quarter of the first pitch according to the present inventive concept.

The present inventive concept is not limited thereto. For example, the lower mask layer 120 may be omitted. In this case, the upper mask layer 130 may include a material having etch selectivity with respect to the etching target layer 110. The formation of the target patterns 112 and 114 may include etching the etching target layer 110 using the first and second interim-mask patterns 132r and 134r as an etch mask.

According to an exemplary embodiment of the present inventive concept, the substrate 100 having the preliminary mask patterns 142 formed thereon may undergo an ion beam etching process using the ion beams IB1 and IB2. During the ion beam etching process, the irradiation directions and the incident angles of the ion beams IB1 and IB2 may be controlled such that the first upper mask patterns 132 may be formed between the preliminary mask patterns 142 (i.e., below the preliminary openings 142a). As a subsequent etching process is performed using the upper mask patterns 132 and 134 formed in the manner described above as an etch mask, the target patterns 112 and 114 may be formed at a fine pitch. With the simplified process according to the present inventive concept, the target patterns 112 and 114 may be formed at a fine pitch. In an exemplary embodiment, the etching target layer 110 may be patterned to have a pitch beyond a resolution limit of a photolithographic apparatus. The present inventive concept is not limited thereto. For example, the etching target layer 110 may be patterned to have a pitch within a resolution limit of a photolithographic apparatus.

FIGS. 9A to 16A are perspective views illustrating a method of fabricating a semiconductor device according to an exemplary embodiment of the present inventive concept. FIGS. 9B to 16B are cross-sectional views taken along line I-I' of FIGS. 9A to 16A according to an exemplary embodiment of the present inventive concept.

Figure 9A:
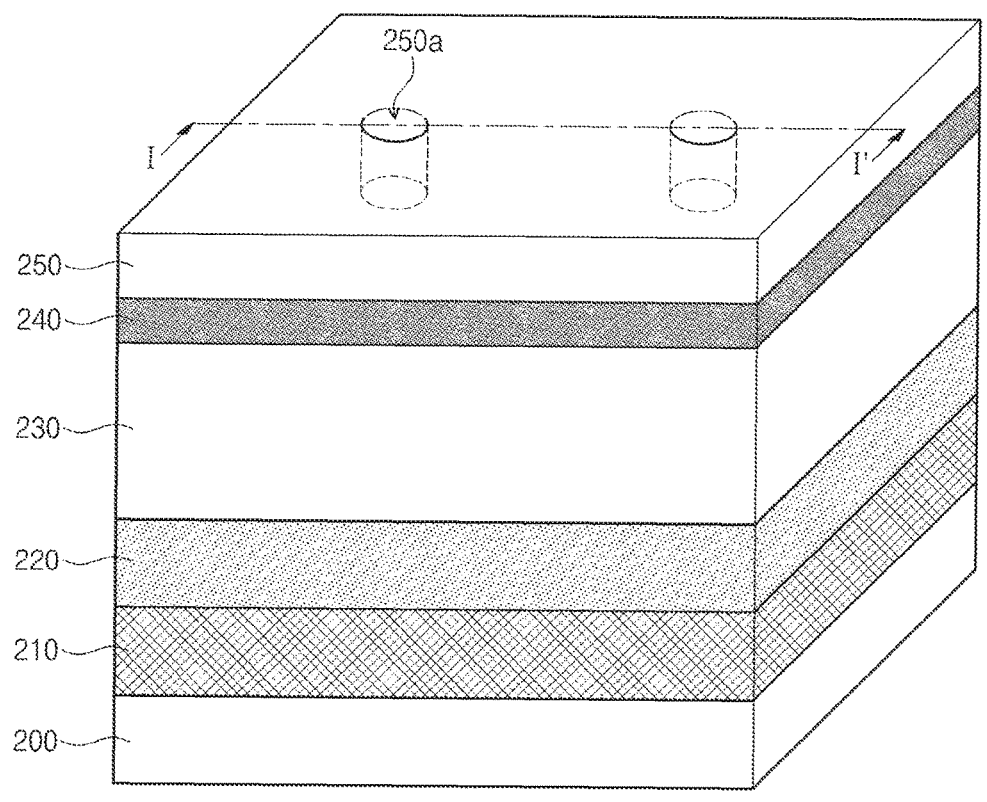

Referring to FIGS. 9A and 9B, an etching target layer 210, a lower mask layer 220, an upper mask layer 230, and a preliminary mask layer 240 may be sequentially formed on a substrate 200. For example, the etching target layer 210, the lower mask layer 220, the upper mask layer 230, and the preliminary mask layer 240 may be sequentially stacked along a first direction D1 substantially perpendicular to a top surface of the substrate 200. The substrate 200, the etching target layer 210, the lower mask layer 220, the upper mask layer 230, and the preliminary mask layer 240 may be substantially the same as the substrate 100, the etching target layer 110, the lower mask layer 120, the upper mask layer 130, and the preliminary mask layer 140 as discussed with reference to FIG. 1.

A sacrificial pattern 250 may be formed on the preliminary mask layer 240. The sacrificial pattern 250 may be photoresist pattern or hardmask pattern. If the sacrificial pattern 250 is hardmask pattern, the sacrificial pattern 250 may include oxide, nitride, or oxynitride that have etch selectivity with respect to the preliminary mask layer 240. The formation of the sacrificial pattern 250 may include performing a photolithography process using a photomask that defines a planar shape of the sacrificial pattern 250.

The sacrificial pattern 250 may include openings 250a spaced apart from each other. Each of the openings 250a may have a circular planar shape, but the present inventive concept is not limited thereto.

Figure 10A:
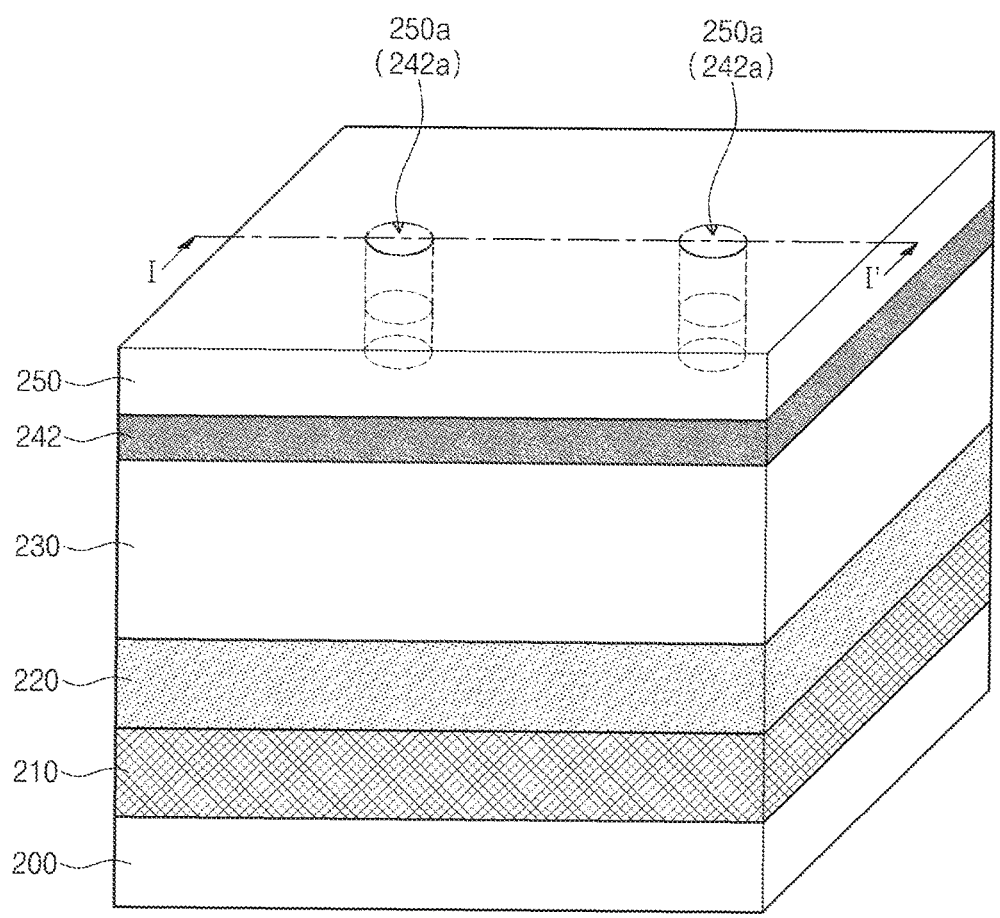
Figure 10B:
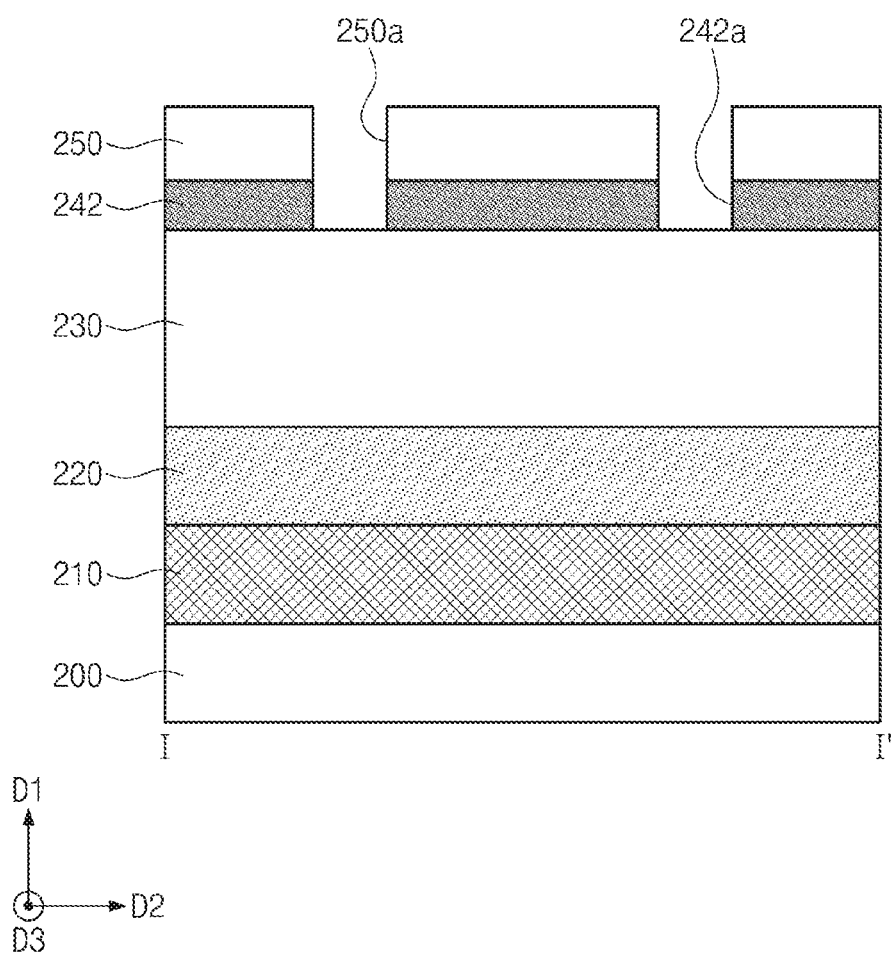

Referring to FIGS. 10A and 10B, a preliminary mask pattern 242 may be formed to have preliminary openings 242a. The formation of the preliminary mask pattern 242 may include performing an etching process using the sacrificial pattern 250 as an etch mask on the preliminary mask layer 240. When viewed in plan, the preliminary openings 242a may correspond to the openings 250a.

Figure 11A:
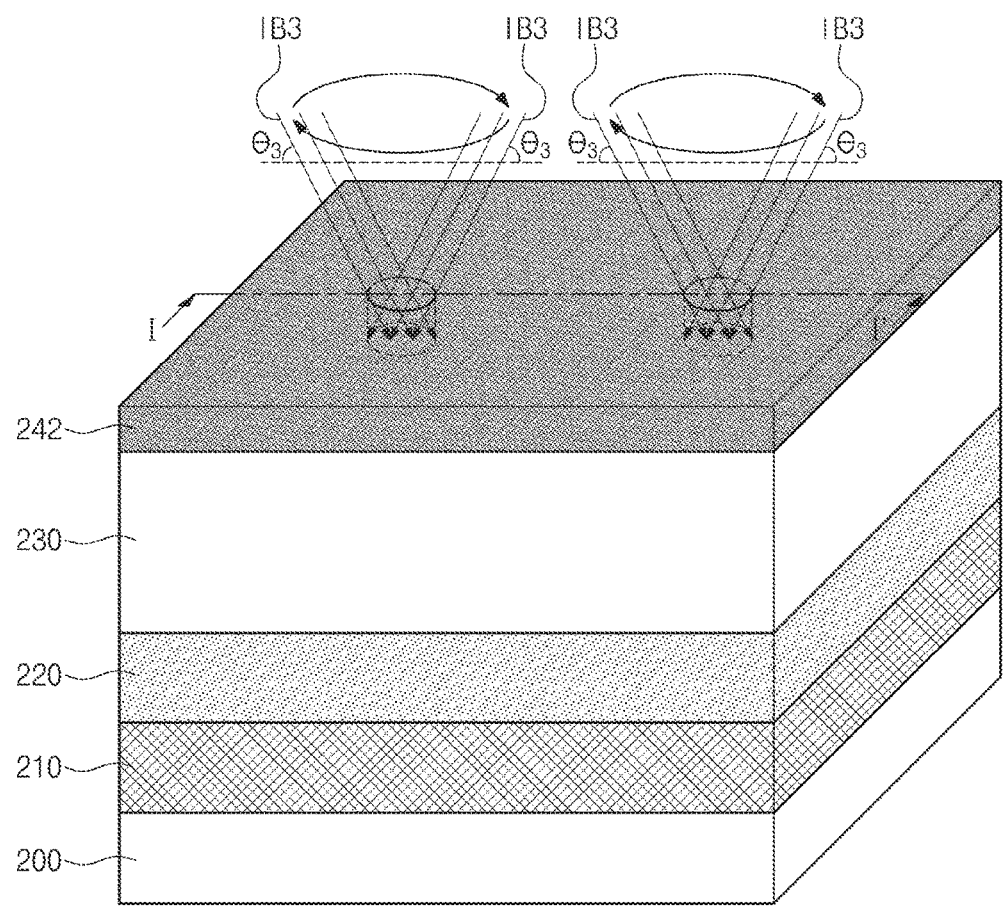
Figure 11B:
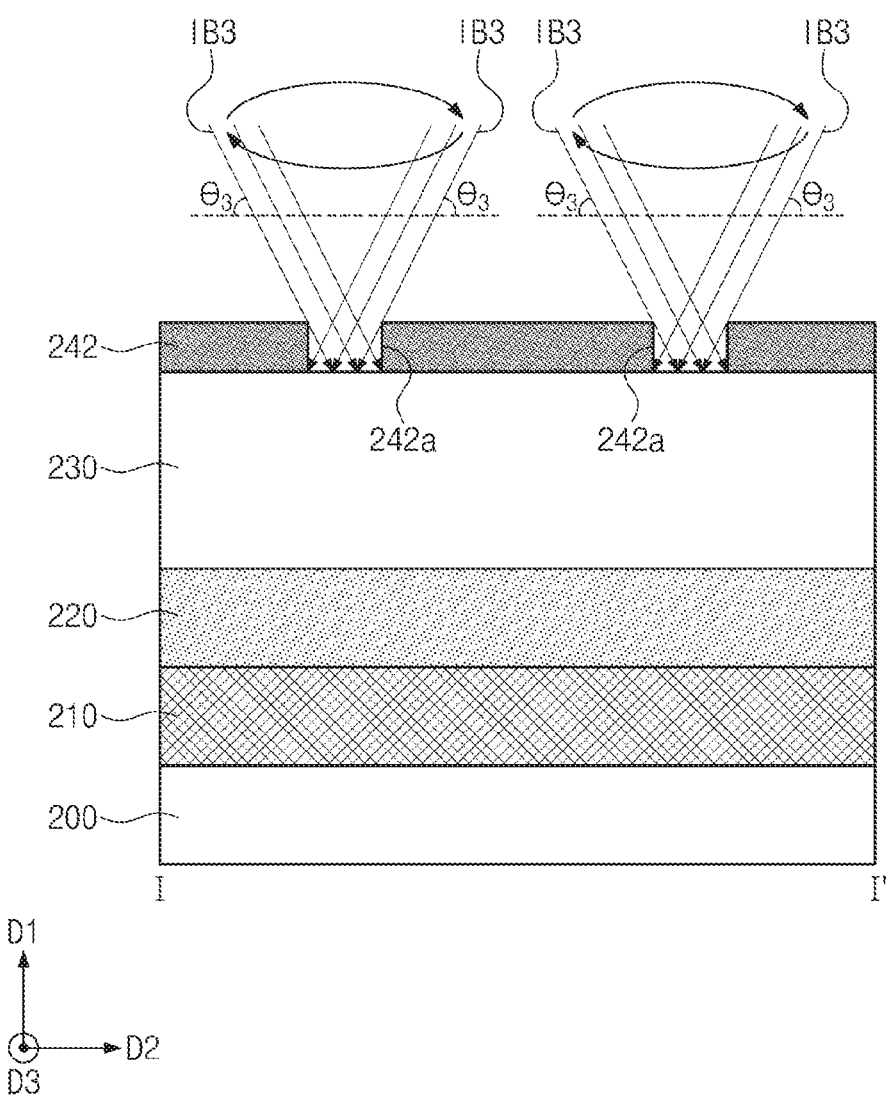
Figure 12A:
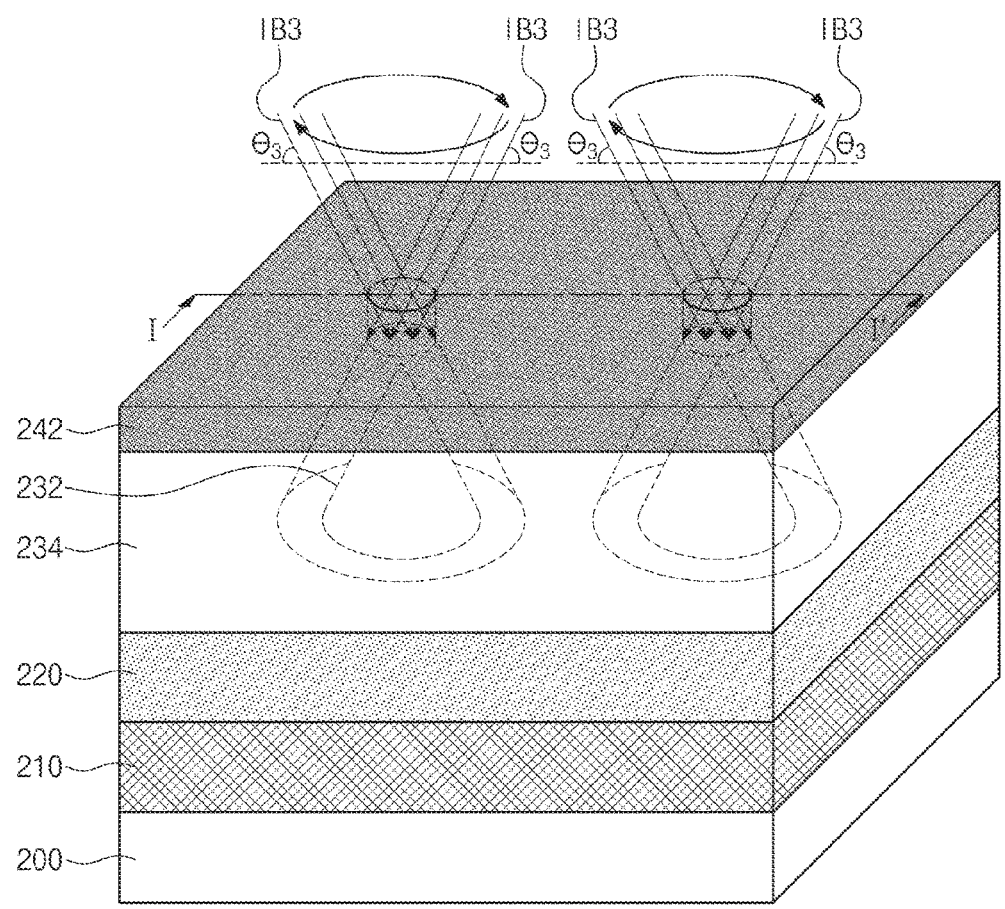
Figure 12B:
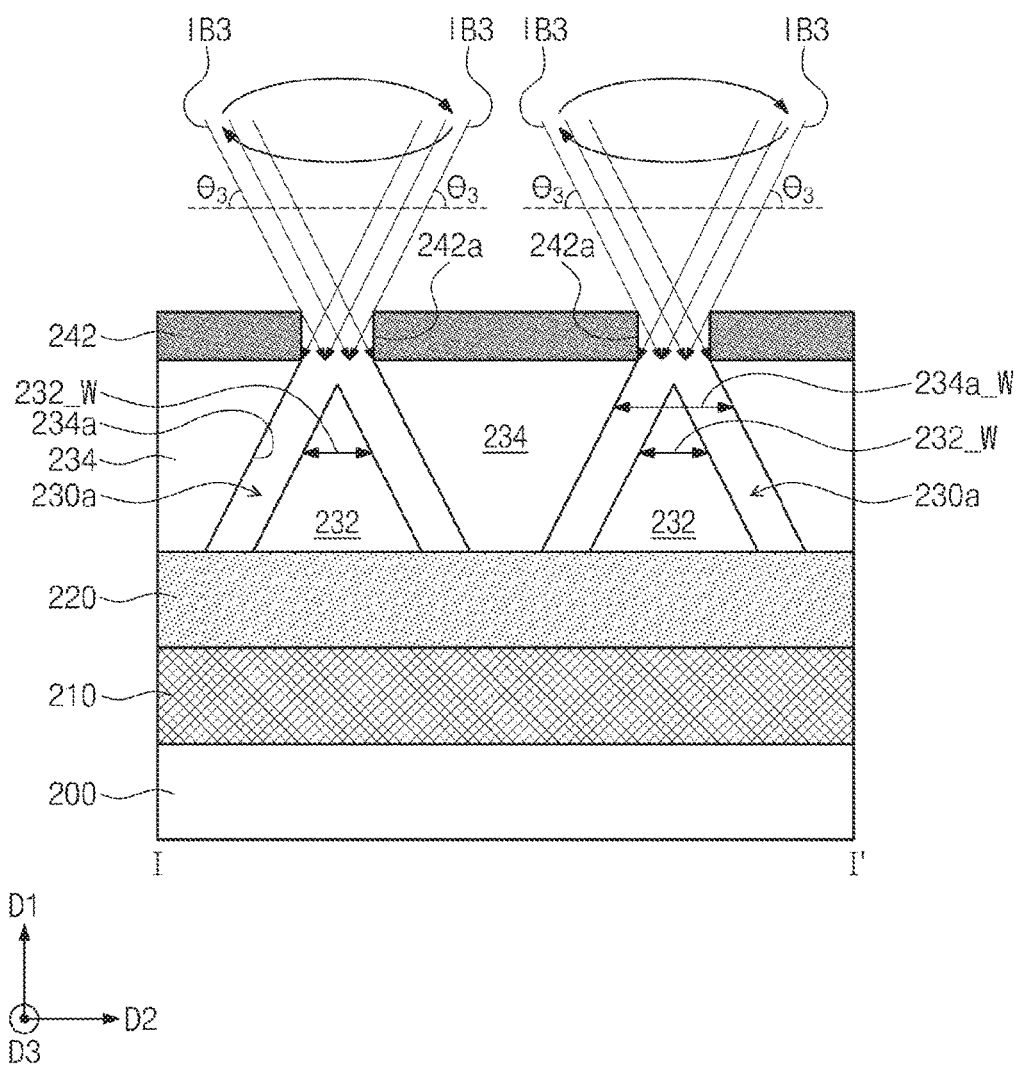

Referring to FIGS. 11A and 11B, the sacrificial pattern 250 may be selectively removed. The selective removal of the sacrificial pattern 250 may be performed by an etching process having etch selectivity with respect to the upper mask layer 230 and the preliminary mask pattern 242.

Referring to FIGS. 11A, 11B, 12A, and 12B, the upper mask layer 230 may be patterned to form upper mask patterns 232 and 234. The upper mask patterns 232 and 234 may be referred to as preliminary-interim-mask patterns. The upper mask patterns 232 and 234 may include first upper mask patterns (first preliminary-interim-mask patterns) 232 and a second upper mask pattern (second preliminary-interim-mask pattern) 234. The first upper mask patterns 232 may be spaced apart from the second upper mask pattern 234. When viewed in plan, the first upper mask patterns 232 may be positioned to correspond to the preliminary openings 242a and to partially overlap the preliminary mask pattern 242. For example, when viewed in plan, each of the first upper mask patterns 232 may have a first portion exposed through the preliminary opening 242a and a second portion overlapped vertically with the preliminary mask pattern 242. When viewed in plan, the second upper mask pattern 234 may overlap the preliminary mask pattern 242 and surround the first upper mask patterns 232.

Each of the first upper mask patterns 232 may have a width 232_W that decreases upwardly in the first direction D1 from the lower mask layer 220 toward the preliminary opening 242a. For example, each of the first upper mask patterns 232 may have a conical shape.

The second upper mask pattern 234 may include gap regions 234a connected to corresponding preliminary openings 242a. Each of the gap regions 234a may have a width 234a_W that decreases upwardly in the first direction from the lower mask layer 220 toward the preliminary opening 242a. Each of the first upper mask patterns 232 may be positioned in a corresponding one of gap regions 234a.

The formation of the upper mask patterns (the preliminary-interim-mask patterns) 232 and 234 may include performing an ion beam etching process using an ion beam IB3. During the ion beam etching process, the ion beam IB3 may be irradiated at an incident angle θ3 with the substrate 200 rotating around its rotational axis along a normal line perpendicular to its top surface. Accordingly, the ion beam IB3 may be irradiated onto the upper mask layer 230 and the preliminary mask pattern 242 at the incident angle θ3, and the substrate 200 may rotate around the rotational axis along a normal line perpendicular to the top surface of the substrate 200. The irradiation and the rotation may be performed at the same time. In this case, the ion beam IB3 may rotate relatively with respect to the substrate 200.

During the ion beam etching process, the ion beam IB3 may form upper openings 230a in the upper mask layer 230 substantially parallel to the irradiation direction of the ion beam IB3 at the incident angle θ3. The upper openings 230a may be connected to corresponding preliminary openings 242a. Due to directionality of the ion beam IB3, each of the upper openings 230a may extend parallel to the irradiation direction of the ion beam IB3.

The upper openings 230a may define the first upper mask patterns 232 and the gap regions 234a of the second upper mask pattern 234. For example, the upper openings 230a may define sidewalls of the first upper mask patterns 232 and inner sidewalls of the gap regions 234a of the second upper mask pattern 234. The incident angle θ3 of the ion beam IB3 may control the degree of inclination of the sidewalls of the first upper mask patterns 232 and of the inner sidewalls of the gap regions 234a of the second upper mask pattern 234.

It has been discussed so far how to form the upper mask patterns 232 and 234 using the ion beam etching process using the ion beam IB3. The present inventive concept, however, is not limited to the above description, and thus any other etching processes having directionality may be employed to form the upper mask patterns 232 and 234.

Figure 13A:
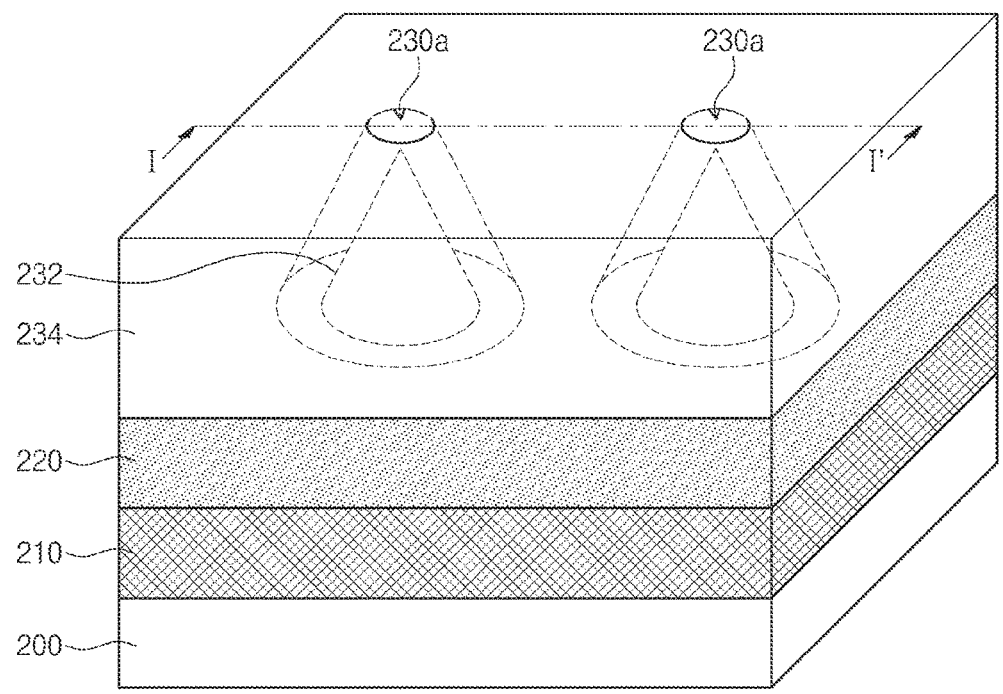
Figure 13B:
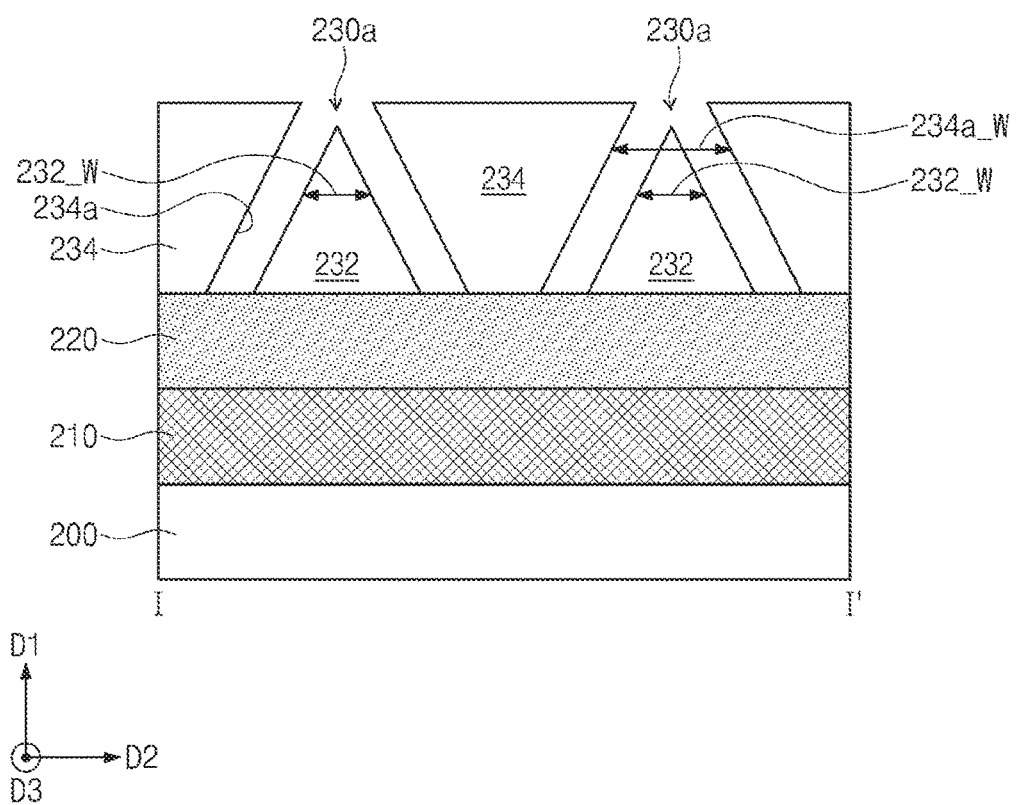

Referring to FIGS. 13A and 13B, the preliminary mask pattern 242 may be selectively removed. The selective removal of the preliminary mask pattern 242 may be performed using, for example, an etching process having etch selectivity with respect to the lower mask layer 220 and the upper mask patterns 232 and 234.

Figure 14A:
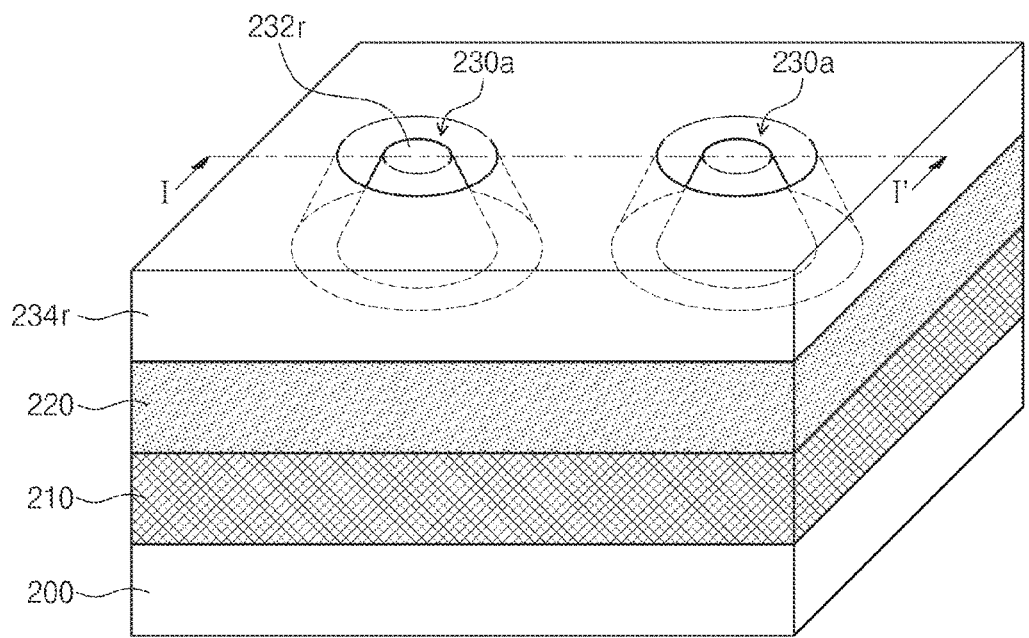
Figure 14B:
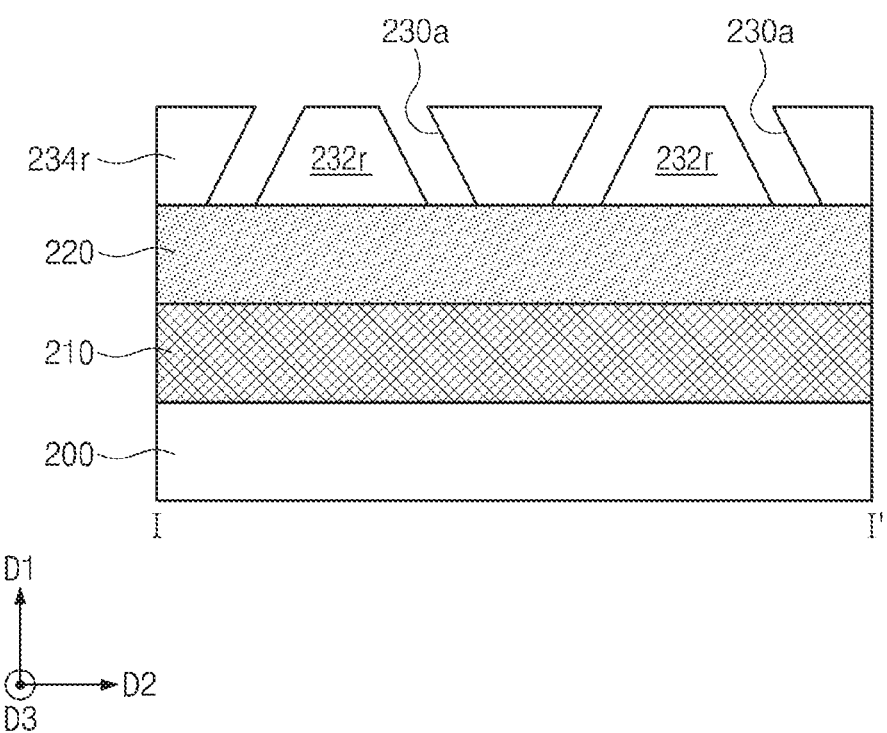

Referring to FIGS. 14A and 14B, a first etching process may be performed on each of the first and second upper mask patterns (the preliminary-interim-mask patterns) 232 and 234 to form first and second upper mask patterns 232r and 234r. In the first etching process, the upper portions of the first and second upper mask patterns 232 and 234 may be removed so that the first and second upper mask patterns 232r and 234r are formed. The first and second upper mask patterns 232r and 234r may also be referred to as interim-mask patterns to be used for patterning the lower mask layer 220. For example, an etch-back process or a chemical mechanical planarization process may be performed to remove the upper portion of each of the first and second upper mask patterns 232 and 234. After the removal process is done, each of the upper openings 230a may have a planar shape of a doughnut or a ring.

In an exemplary embodiment, the first etching process to form the interim-mask patterns 232r and 234r may performed at least until the first interim-mask patterns 232r and the second interim-mask patterns 234r may be non-overlapped vertically in the first direction D1.

Figure 15A:
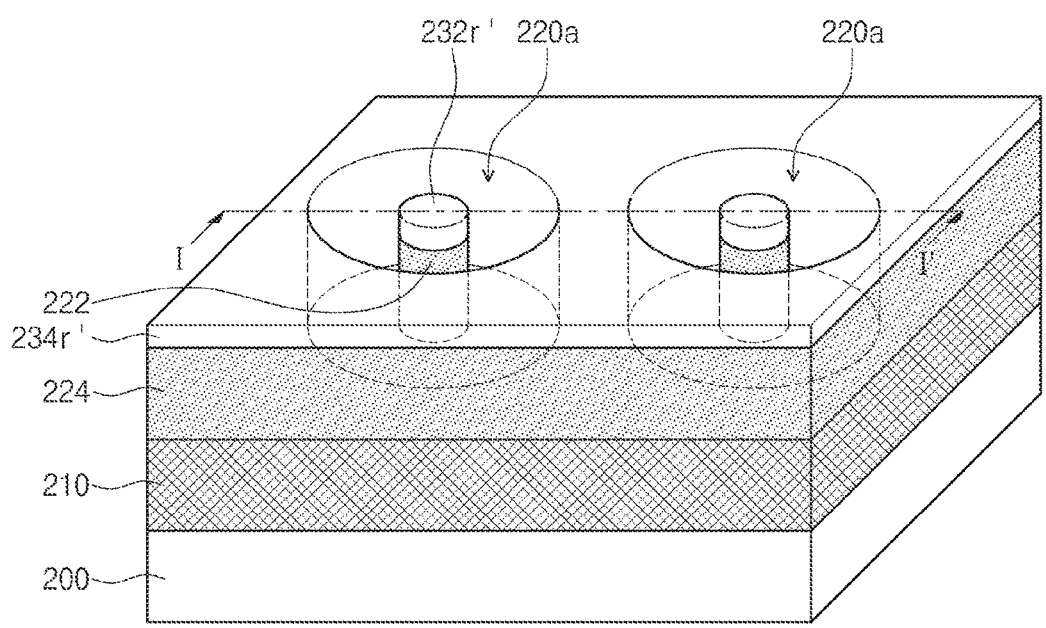
Figure 15B:
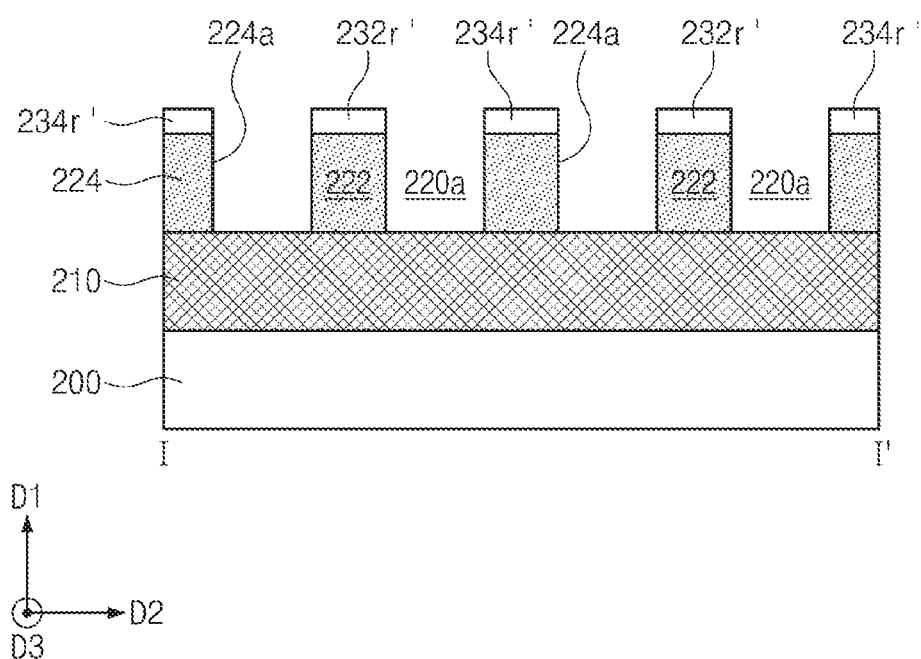

Referring to FIGS. 15A and 15B, lower mask patterns 222 and 224 may be formed. The lower mask patterns 222 and 224 may be referred to as target mask patterns. The formation of the lower mask patterns 222 and 224 may include performing a second etching process on the lower mask layer 220 using the thickness-reduced first and second upper mask patterns (the first and second interim-mask patterns) 232r and 234r as an etch mask. The second etching process may further reduce thicknesses of the first and second upper mask patterns 232r and 234r so that remaining-interim-mask patterns 232r' and 234r' are formed. During the second etching process, first lower mask patterns 222 may be formed below the first remaining-interim-mask patterns 232r' respectively, and second lower mask patterns 224 may be formed below the second remaining-interim-mask patterns 234r'. The first and second interim-mask patterns 232r and 234r of FIGS. 14A and 14B may shrink in size while the second etching process is performed.

Each of the first lower mask patterns (the first target mask patterns) 222 may have a pillar shape. For example, each of the first lower mask patterns 222 may have a cylindrical shape. The second lower mask pattern (the second target mask pattern) 224 may have gap regions 224a, and each of the first lower mask patterns 222 may be positioned in a corresponding one of the gap regions 224a. The second lower mask pattern 224 may be spaced apart from the first lower mask patterns 222, and therefore lower openings 220a may be defined between the second lower mask pattern 224 and the first lower mask patterns 222. For example, the lower openings 220a may be defined by inner walls of the gap regions 224a. The inner walls of the gap regions 224a may be defined by sidewalls of the second lower mask pattern 224 and sidewalls of the first lower mask patterns 222. Each of the lower openings 220a may have a planar shape of a doughnut or a ring.

Figure 16A:
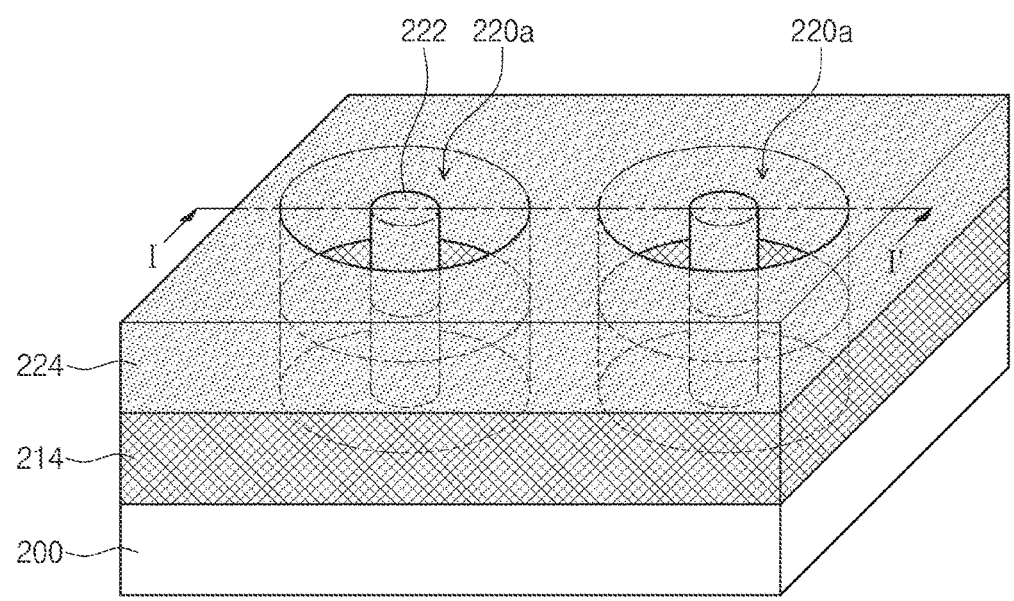
Figure 16B:
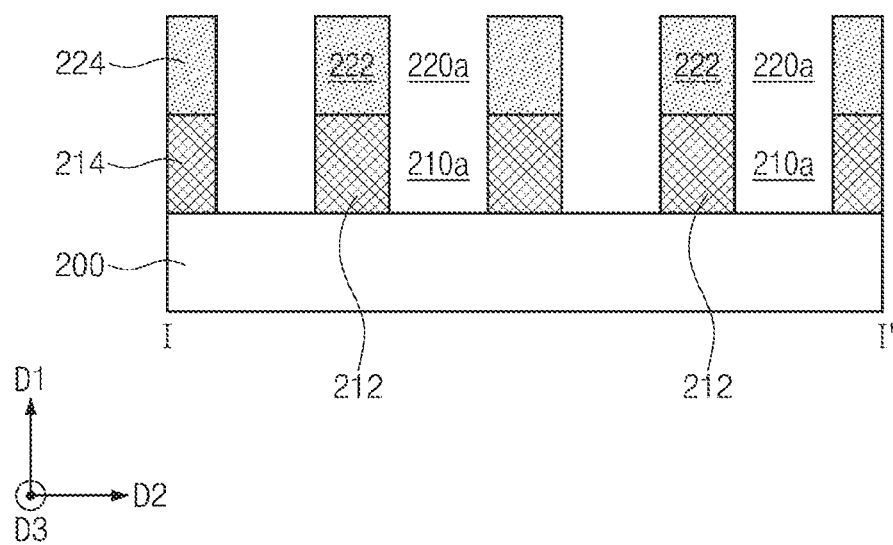

Referring to FIGS. 16A and 16B, target patterns 212 and 214 may be formed. The formation of the target patterns 212 and 214 may include performing a third etching process on the etching target layer 210 using the first and second lower mask patterns 222 and 224 as an etch mask. The third etching process may form first target patterns 212 below the first lower mask patterns (the first target mask patterns) 222 and a second target pattern 214 below the second lower mask pattern (the second target mask pattern) 224.

Target openings 210a may be defined between the second target pattern 214 and the first target patterns 212. The target openings 210a may correspond to the lower openings 220a. Accordingly, each of the target openings 210a may have a planar shape of a doughnut or a ring.

In an exemplary embodiment, each of the target openings 210a may be provided therein with a capacitor (not shown) including a bottom electrode, a dielectric layer, and a top electrode.

The present inventive concept is not limited thereto. For example, the lower mask layer 220 may be omitted. In this case, the upper mask layer 230 may include a material having etch selectivity with respect to the etching target layer 210. If the lower mask layer 220 is omitted, the formation of the target patterns 212 and 214 may include performing an etching process on the etching target layer 210 using the first and second interim-mask patterns 232r and 234r as an etch mask.

FIGS. 17A to 19A are plan views illustrating a method of fabricating a semiconductor device according to an exemplary embodiment of the present inventive concept. FIGS. 17B to 19B are cross-sectional views taken along line I-I' of FIGS. 17A to 19A according to an exemplary embodiment of the present inventive concept. Note that substantially the same elements as those discussed with reference to FIGS. 9A to 16A and 9B to 16B are referenced with the same reference numerals, and a repetitive description thereof will be omitted.

Figure 17A:
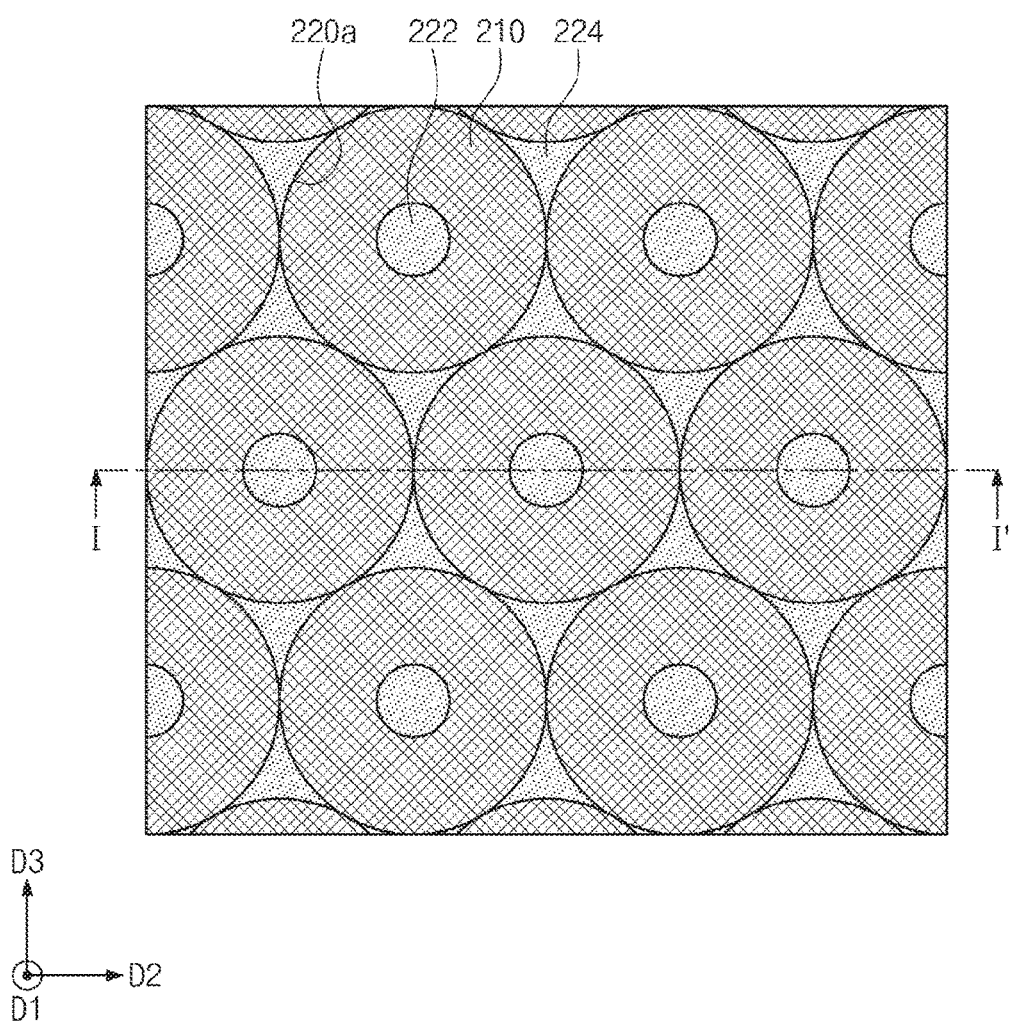
Figure 17B:
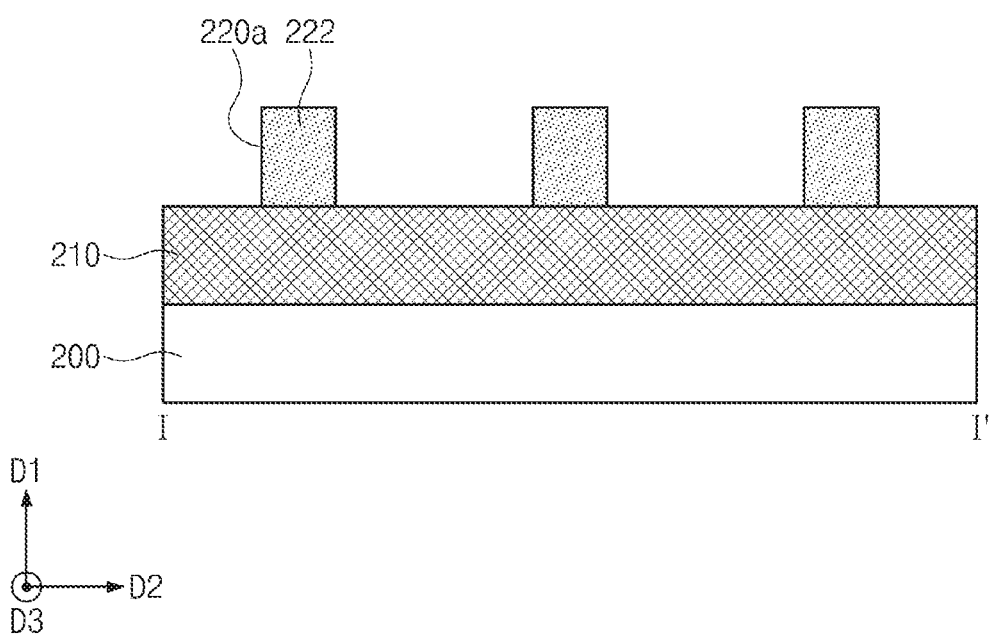

Referring to FIGS. 17A and 17B, the first and second lower mask patterns 222 and 224 may be formed in such a way that the lower openings 220a may be in contact with each other (or connected to each other). For example, as shown in FIGS. 17A and 17B, three neighboring lower openings 220a may be in contact with each other. Therefore, each of the second lower mask patterns 224 may be formed to have a pillar shape positioned between the lower openings 220a in contact with each other. The present inventive concept is not limited thereto. The second lower mask patterns 224 each having a pillar shape may be separated from each other. The first and second lower mask patterns 222 and 224 may be spaced apart from each other. The first and second lower mask patterns 222 and 224 may be formed by the same method as that discussed with reference to FIGS. 9A to 15A and 9B to 15B.

Figure 18A:
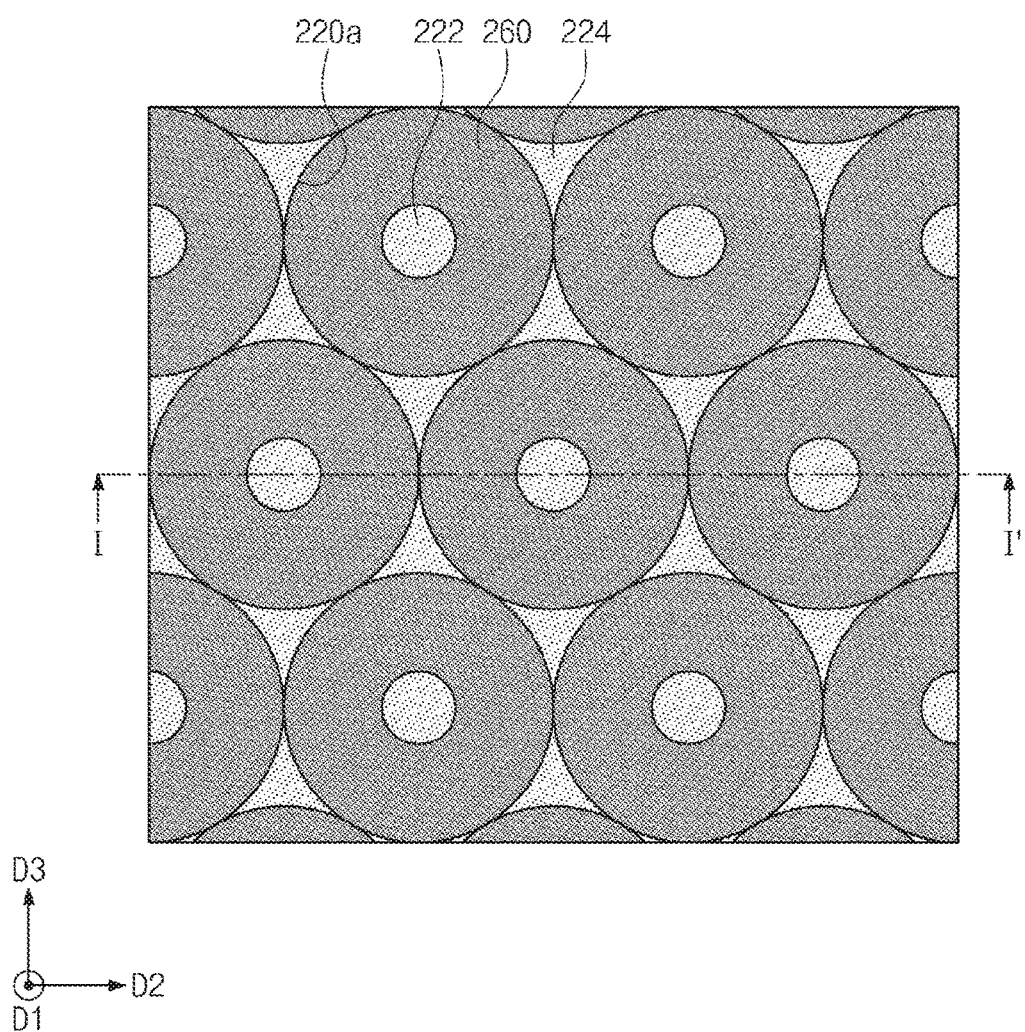
Figure 18B:
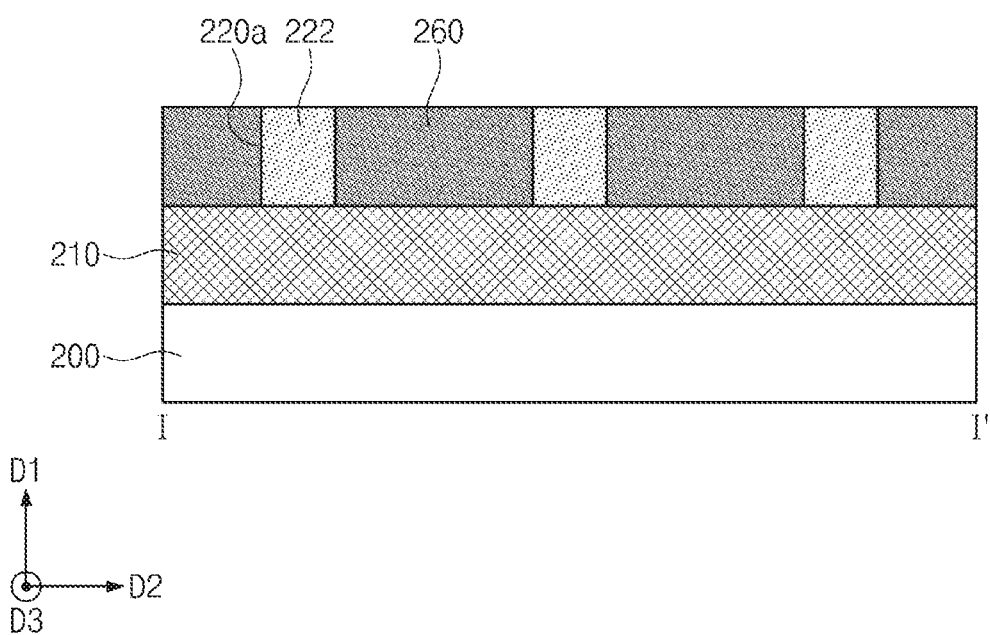

Referring to FIGS. 18A and 18B, a sacrificial mask layer 260 may be formed to fill the lower openings 220a connected to each other. The sacrificial mask layer 260 may include a material having etch selectivity with respect to the etching target layer 210 and the first and second lower mask patterns 222 and 224. The sacrificial mask layer 260 may be formed by, for example, a spin coating process.

Figure 19A:
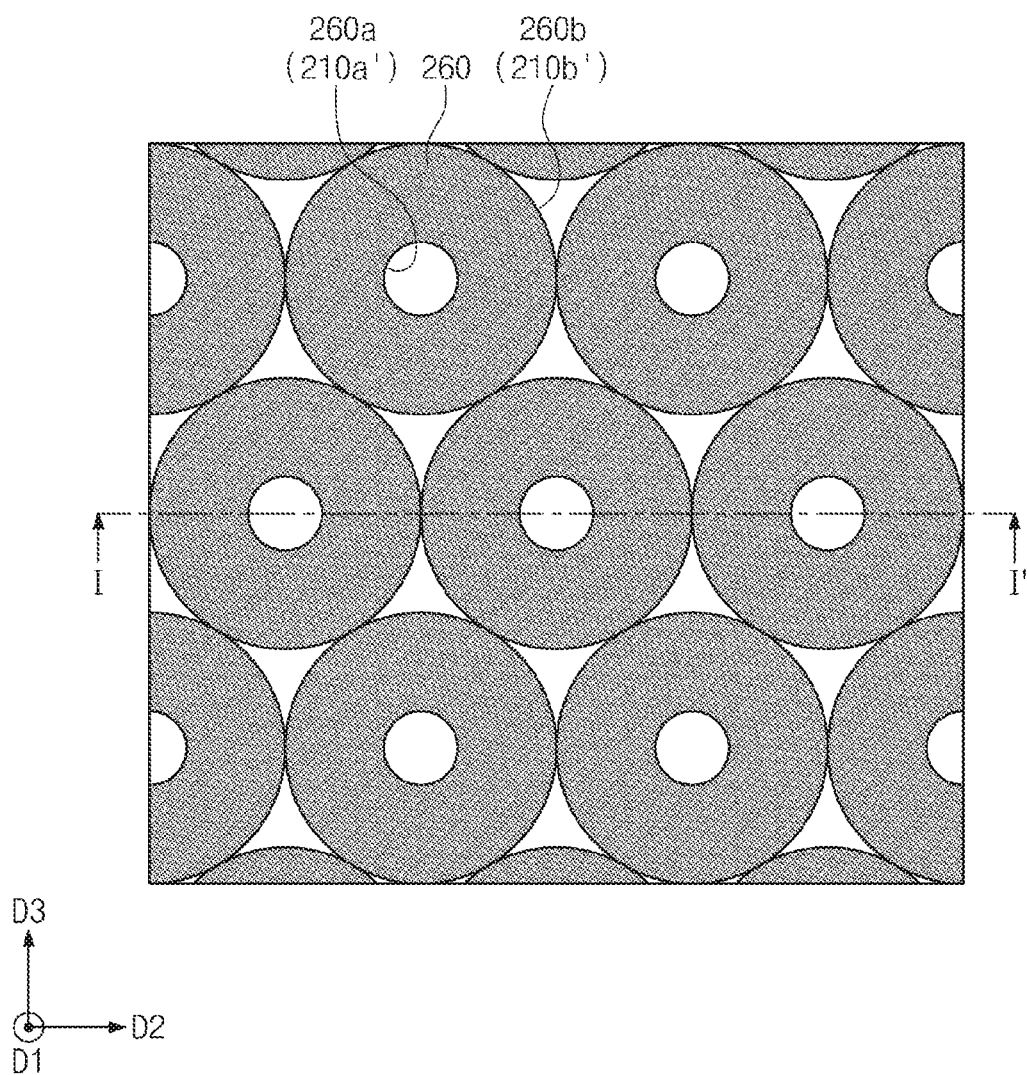
Figure 19B:
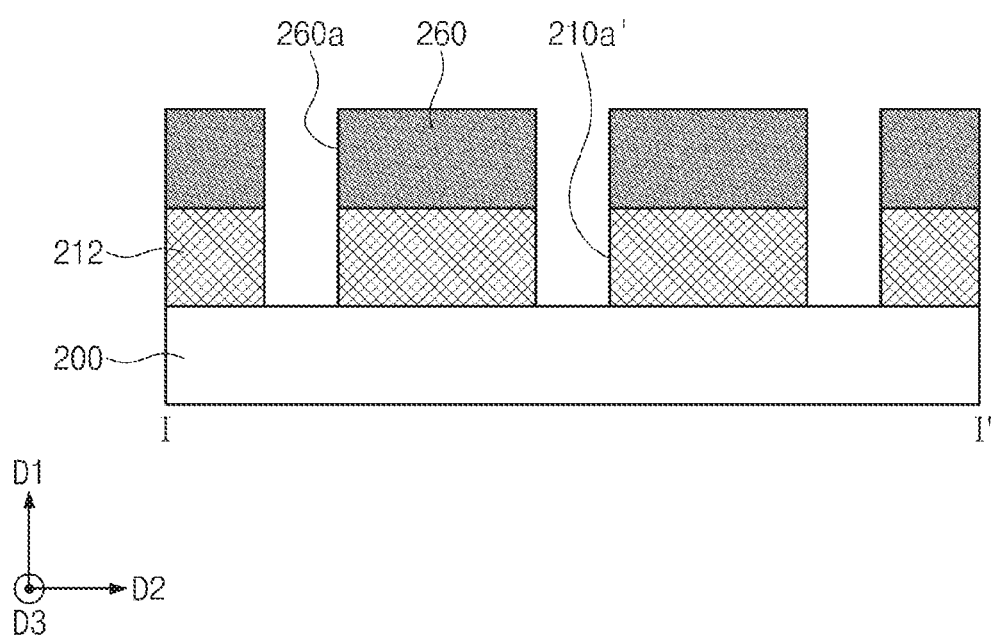

Referring to FIGS. 19A and 19B, the first and second lower mask patterns 222 and 224 may be selectively removed. Thus, first and second sacrificial holes 260a and 260b may be formed in the sacrificial mask layer 260. The first sacrificial holes 260a may correspond to regions from which the first lower mask patterns 222 are removed, and the second sacrificial holes 260b may correspond to regions from which the second lower mask patterns 224 are removed.

Thereafter, the target patterns 212 may be formed to include first and second target holes 210a' and 210b'. The formation of the target patterns 212 may include etching the etching target layer 210 using the sacrificial mask layer 260, which have the first and second sacrificial holes 260a and 260b, as an etch mask. When viewed in plan, the first target holes 210a' may correspond to the first sacrificial holes 260a, and the second target holes 210b' may correspond to the second sacrificial holes 260b.

According to an exemplary embodiment of the present inventive concept, a substrate having preliminary mask patterns formed thereon may undergo an ion beam etching process using ion beams. During the ion beam etching process, the irradiation directions and the incident angles of the ion beams may be controlled such that upper mask patterns may be formed not only below the preliminary mask patterns but also between the preliminary mask patterns (i.e., below preliminary openings). As a subsequent etching process is performed using the upper mask patterns formed in the manner described above, target patterns may be formed at a fine pitch. Therefore, a simplified process may be performed to form the target patterns arranged at a fine pitch.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of fabricating a semiconductor device, the method comprising:
   forming an etching target layer on a substrate;
   forming an upper mask layer on the etching target layer;
   forming a plurality of preliminary mask patterns on the upper mask layer, two neighboring preliminary mask patterns of the plurality of preliminary mask patterns defining a preliminary opening; and
   performing an ion beam etching process on the upper mask layer using the plurality of preliminary mask patterns as an etch mask to form a first preliminary-interim-mask pattern and a pair of second preliminary-interim-mask patterns,
   wherein the first preliminary-interim-mask pattern is formed between one of the pair of second preliminary-interim-mask patterns and the other of the pair of second preliminary-interim-mask patterns.

2. The method of claim 1,
   wherein one of the two neighboring preliminary mask patterns comprises a first sidewall and the other of the two neighboring preliminary mask patterns comprises a second sidewall facing the first sidewall across the preliminary opening, and
   wherein the performing of the ion beam etching process comprises:
   irradiating a first ion beam toward the first sidewall at a first irradiation direction; and
   irradiating a second ion beam toward the second sidewall at a second irradiation direction.

3. The method of claim 2,
   wherein the irradiating of the first ion beam forms a first upper opening in the upper mask layer,
   wherein the irradiating of the second ion beam forms a second upper opening in the upper mask layer, and
   wherein the first and second upper openings are connected to the preliminary opening.

4. The method of claim 3,
   wherein the first and second upper openings are spaced apart from each other at an interval that decreases upwardly from the substrate toward the preliminary opening.

5. The method of claim 3,
   wherein the first upper opening is interposed between the first preliminary-interim-mask pattern and one of the pair of second preliminary-interim-mask patterns, and
   wherein the second upper opening is interposed between the first preliminary-interim-mask pattern and the other of the pair of second preliminary-interim-mask patterns.

6. The method of claim 3,
   wherein the first upper opening defines a sidewall of the first preliminary-interim-mask pattern, and
   wherein the second upper opening defines an opposite sidewall of the first preliminary-interim-mask pattern.

7. The method of claim 1,
   wherein, when viewed in plan, the first preliminary-interim-mask pattern has a first portion exposed through the preliminary opening and a second portion overlapped with the two neighboring preliminary mask patterns.

8. The method of claim 1,
   wherein each of the plurality of preliminary mask patterns extends along a first direction,
   wherein the plurality of preliminary mask patterns is spaced apart from each other in a second direction crossing the first direction, and
   wherein the first preliminary-interim-mask pattern has a width in the second direction, a width of the first preliminary-interim-mask pattern decreasing upwardly from the substrate toward the preliminary opening.

9. The method of claim 8,
   wherein each of the pair of second preliminary-interim-mask patterns has a width in the second direction, a width of each of the pair of second preliminary-interim-mask patterns increasing upwardly from the substrate toward one of the plurality of preliminary mask patterns.

10. The method of claim 1, further comprising:
    removing an upper portion of the first preliminary-interim-mask pattern and an upper portion of each of the pair of second preliminary-interim-mask patterns to form a first interim-mask pattern and a pair of second interim-mask patterns.

11. The method of claim 10, wherein the plurality of preliminary mask patterns is arranged at a first pitch, and wherein the method further comprises:
    forming a lower mask layer between the etching target layer and the upper mask layer;
    patterning the lower mask layer using the first interim-mask pattern and the pair of second interim-mask patterns as an etch mask to form target mask patterns arranged at a second pitch less than the first pitch; and
    patterning the etching target layer using the target mask patterns.

12. A method of fabricating a semiconductor device, the method comprising:
    forming an etching target layer on a substrate;
    forming an upper mask layer on the etching target layer;
    forming a preliminary mask pattern on the upper mask layer, the preliminary mask pattern having a preliminary opening exposing a portion of the upper mask layer; and
    performing an ion beam etching process on the upper mask layer using the preliminary mask pattern as an etch mask to form a first preliminary-interim-mask pattern and a second preliminary-interim-mask pattern,
    wherein the ion beam etching process is performed through the preliminary opening on the upper mask layer such that the first preliminary-interim-mask pattern, when viewed in plan, is formed below the preliminary opening and the second preliminary-interim-mask pattern, when viewed in plan, is formed below the preliminary mask pattern.

13. The method of claim 12,
wherein the performing of the ion beam etching process comprises:
irradiating an ion beam at an irradiation direction on the upper mask layer; and
rotating the substrate.

14. The method of claim 12,
wherein the first preliminary-interim-mask pattern has a conical shape, and
wherein the first preliminary-interim-mask pattern is surrounded by the second preliminary-interim-mask pattern, in plan view.

15. The method of claim 12, further comprising:
removing an upper portion of the first preliminary-interim-mask pattern and an upper portion of the second preliminary-interim-mask pattern to form a first interim-mask pattern and a second interim-mask pattern.

16. The method of claim 15, further comprising:
forming a lower mask layer between the etching target layer and the upper mask layer;
patterning the lower mask layer using the first interim-mask pattern and the second interim-mask pattern as an etch mask to form target mask patterns; and
patterning the etching target layer using the target mask patterns.

17. A method of fabricating a semiconductor device, the method comprising:
forming an etching target layer on a substrate;
forming an upper mask layer on the etching target layer;
forming a plurality of preliminary mask patterns on the upper mask layer, the plurality of preliminary mask patterns being spaced apart from each other; and
performing an ion beam etching process on the upper mask layer to form a plurality of preliminary-interim-mask patterns having a triangular-prism shape and a trapezoidal-prism shape alternately.

18. The method of claim 17, wherein the plurality of preliminary mask patterns is arranged at a first pitch, and
wherein the method further comprises:
forming a lower mask layer between the etching target layer and the upper mask layer;
forming a plurality of interim-mask patterns by removing partially an upper portion of each of the plurality of preliminary-interim-mask patterns; and
patterning the lower mask layer using the plurality of interim-mask patterns as an etch mask to a plurality of target mask patterns,
wherein the plurality of target mask patterns is arranged at a second pitch smaller than the first pitch.

19. The method of claim 18,
wherein the removing partially of the upper portion of each of the plurality of preliminary-interim-mask patterns is performed at least until two neighboring interim-mask patterns of the plurality of interim-mask patterns are non-overlapped vertically with each other.

20. The method of claim 17,
wherein the performing of the ion beam etching process includes:
irradiating a first ion beam at a first irradiation direction on the upper mask layer through the plurality of preliminary-interim-mask patterns; and
irradiating a second ion beam at a second irradiation direction on the upper mask layer through the plurality of preliminary-interim-mask patterns,
wherein the irradiating of the first ion beam and the irradiating of the second ion beam are controlled to pattern the upper mask layer to the plurality of preliminary-interim-mask patterns.

* * * * *